(12) United States Patent
Kimura et al.

(10) Patent No.: US 9,704,996 B2
(45) Date of Patent: *Jul. 11, 2017

(54) SEMICONDUCTOR DEVICE

(71) Applicant: Semiconductor Energy Laboratory Co., Ltd., Atsugi-shi, Kanagawa-ken (JP)

(72) Inventors: Hajime Kimura, Kanagawa (JP); Rumo Satake, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/476,810

(22) Filed: Sep. 4, 2014

(65) Prior Publication Data

US 2014/0367690 A1 Dec. 18, 2014

Related U.S. Application Data

(60) Continuation of application No. 13/940,475, filed on Jul. 12, 2013, now Pat. No. 8,829,529, which is a continuation of application No. 13/276,367, filed on Oct. 19, 2011, now Pat. No. 8,487,315, which is a division of application No. 12/552,303, filed on Sep. 2, 2009, now Pat. No. 8,042,984, which is a continuation of application No. 11/690,190, filed on Mar. 23, 2007, now Pat. No. 7,594,743, which is a
(Continued)

(30) Foreign Application Priority Data

Apr. 12, 2000 (JP) .................................. 2000-111345

(51) Int. Cl.
*H01L 29/786* (2006.01)
*F21V 8/00* (2006.01)
*G02F 1/1335* (2006.01)

(52) U.S. Cl.
CPC .......... *H01L 29/786* (2013.01); *G02B 6/0028* (2013.01); *G02B 6/0031* (2013.01); *G02B 6/0038* (2013.01); *G02B 6/0043* (2013.01); *G02B 6/0046* (2013.01); *G02B 6/0055* (2013.01); *G02F 1/1336* (2013.01); *G02F 1/133615* (2013.01)

(58) Field of Classification Search
CPC ..................................................... H01L 29/786
USPC ..................................................... 257/59, 72
See application file for complete search history.

(56) References Cited

U.S. PATENT DOCUMENTS 3,761,704 A 9/1973 Takeichi et al.
4,297,719 A * 10/1981 Hsu .................... G11C 16/0425
257/316
(Continued)

FOREIGN PATENT DOCUMENTS

EP 0095776 A 12/1983
EP 0650197 A 4/1995
(Continued)

*Primary Examiner* — Mark Prenty
(74) *Attorney, Agent, or Firm* — Fish & Richardson P.C.

(57) ABSTRACT

A semiconductor device comprises a semiconductor film and a gate electrode with a gate insulating film interposed therebetween, a conductive film, an insulating film over the gate electrode and the conductive film, and a gate wiring over the insulating film. The gate wiring extends across the conductive film.

12 Claims, 31 Drawing Sheets

Related U.S. Application Data continuation of application No. 10/932,022, filed on Sep. 2, 2004, now Pat. No. 7,204,635, which is a continuation of application No. 09/833,397, filed on Apr. 11, 2001, now Pat. No. 6,789,910.

(56) References Cited

U.S. PATENT DOCUMENTS

| | | |
|---|---|---|
| 4,341,593 A | 7/1982 | Kurisaki et al. |
| 4,460,940 A | 7/1984 | Mori |
| 4,513,397 A * | 4/1985 | Ipri .................... G11C 16/0425 257/316 |
| 4,583,122 A | 4/1986 | Ohwada et al. |
| 4,729,068 A | 3/1988 | Ohe |
| 4,914,503 A | 4/1990 | Shirato et al. |
| 4,954,930 A | 9/1990 | Maegawa et al. |
| 5,057,886 A * | 10/1991 | Riemenschneider ..................... H01L 29/7885 257/317 |
| 5,075,674 A | 12/1991 | Katayama et al. |
| 5,153,685 A | 10/1992 | Murata et al. |
| 5,182,620 A | 1/1993 | Shimada et al. |
| 5,363,294 A | 11/1994 | Yamamoto et al. |
| 5,483,082 A | 1/1996 | Takizawa et al. |
| 5,491,352 A | 2/1996 | Tsuji |
| 5,528,709 A | 6/1996 | Koike et al. |
| 5,550,070 A | 8/1996 | Funai et al. |
| 5,576,858 A | 11/1996 | Ukai et al. |
| 5,608,251 A | 3/1997 | Konuma et al. |
| 5,620,905 A | 4/1997 | Konuma et al. |
| 5,636,329 A | 6/1997 | Sukegawa et al. |
| 5,643,826 A | 7/1997 | Ohtani et al. |
| 5,644,147 A | 7/1997 | Yamazaki et al. |
| 5,650,636 A | 7/1997 | Takemura et al. |
| 5,655,827 A | 8/1997 | Kaneko et al. |
| 5,712,495 A | 1/1998 | Suzawa |
| 5,717,224 A | 2/1998 | Zhang |
| 5,729,311 A | 3/1998 | Broer et al. |
| 5,739,549 A | 4/1998 | Takemura et al. |
| 5,744,820 A | 4/1998 | Matsushima et al. |
| 5,757,444 A | 5/1998 | Takemura |
| 5,777,701 A | 7/1998 | Zhang |
| 5,780,872 A | 7/1998 | Misawa et al. |
| 5,804,501 A | 9/1998 | Kim |
| 5,815,226 A | 9/1998 | Yamazaki et al. |
| 5,818,070 A | 10/1998 | Yamazaki et al. |
| 5,821,138 A | 10/1998 | Yamazaki et al. |
| 5,828,429 A | 10/1998 | Takemura |
| 5,838,412 A | 11/1998 | Ueda et al. |
| 5,852,488 A | 12/1998 | Takemura |
| 5,856,689 A | 1/1999 | Suzawa |
| 5,857,761 A | 1/1999 | Abe et al. |
| 5,892,562 A | 4/1999 | Yamazaki et al. |
| 5,899,547 A | 5/1999 | Yamazaki et al. |
| 5,917,563 A | 6/1999 | Matsushima |
| 5,920,083 A | 7/1999 | Bae |
| 5,923,962 A | 7/1999 | Ohtani et al. |
| 5,929,948 A | 7/1999 | Ohori et al. |
| 5,930,607 A | 7/1999 | Satou |
| 5,953,084 A | 9/1999 | Shimada et al. |
| 5,953,088 A | 9/1999 | Hanazawa et al. |
| 5,977,562 A | 11/1999 | Hirakata et al. |
| 5,985,746 A | 11/1999 | Kapoor |
| 5,990,542 A | 11/1999 | Yamazaki |
| 5,990,998 A | 11/1999 | Park et al. |
| 5,990,999 A | 11/1999 | Yeo |
| 5,994,235 A | 11/1999 | O'Donnell |
| 5,998,841 A | 12/1999 | Suzawa |
| 6,008,065 A | 12/1999 | Lee et al. |
| 6,011,602 A | 1/2000 | Miyashita et al. |
| 6,020,944 A | 2/2000 | Hoshi |
| 6,022,753 A | 2/2000 | Park et al. |
| 6,031,290 A | 2/2000 | Miyazaki et al. |
| 6,052,162 A | 4/2000 | Shimada et al. |
| 6,067,132 A | 5/2000 | Kim |
| 6,072,556 A | 6/2000 | Hirakata et al. |
| 6,081,308 A | 6/2000 | Jeong et al. |
| 6,097,452 A | 8/2000 | Shimada et al. |
| 6,104,461 A | 8/2000 | Zhang et al. |
| 6,114,715 A | 9/2000 | Hamada |
| 6,115,088 A | 9/2000 | Zhang et al. |
| 6,118,506 A | 9/2000 | Yamazaki et al. |
| 6,124,604 A | 9/2000 | Koyama et al. |
| 6,132,053 A | 10/2000 | Sendova |
| 6,166,396 A | 12/2000 | Yamazaki |
| 6,167,182 A | 12/2000 | Shinohara et al. |
| 6,175,395 B1 | 1/2001 | Yamazaki et al. |
| 6,195,138 B1 | 2/2001 | Shimada et al. |
| 6,198,133 B1 | 3/2001 | Yamazaki et al. |
| 6,198,517 B1 | 3/2001 | Ohori et al. |
| 6,208,395 B1 | 3/2001 | Kanoh et al. |
| 6,218,196 B1 | 4/2001 | Ise et al. |
| 6,218,206 B1 | 4/2001 | Inoue et al. |
| 6,229,513 B1 | 5/2001 | Nakano et al. |
| 6,231,200 B1 | 5/2001 | Shinohara et al. |
| 6,239,854 B1 | 5/2001 | Hirakata et al. |
| 6,274,887 B1 | 8/2001 | Yamazaki et al. |
| 6,278,131 B1 | 8/2001 | Yamazaki et al. |
| 6,281,552 B1 | 8/2001 | Kawasaki et al. |
| 6,286,970 B1 | 9/2001 | Egawa et al. |
| 6,293,683 B1 | 9/2001 | Okada |
| 6,303,963 B1 | 10/2001 | Ohtani et al. |
| 6,323,515 B1 | 11/2001 | Yamazaki et al. |
| 6,337,520 B1 | 1/2002 | Jeong et al. |
| 6,337,731 B1 | 1/2002 | Takemura |
| 6,358,766 B1 | 3/2002 | Kasahara |
| 6,359,668 B1 | 3/2002 | Iijima et al. |
| 6,376,333 B1 | 4/2002 | Yamazaki et al. |
| 6,380,098 B1 | 4/2002 | Jeong et al. |
| 6,384,818 B1 | 5/2002 | Yamazaki et al. |
| 6,392,255 B1 | 5/2002 | Shibata et al. |
| 6,396,105 B1 | 5/2002 | Yamazaki et al. |
| 6,421,101 B1 | 7/2002 | Zhang et al. |
| 6,433,851 B2 | 8/2002 | Shimada et al. |
| 6,435,687 B1 | 8/2002 | Fukiharu |
| 6,441,468 B1 | 8/2002 | Yamazaki |
| 6,445,004 B1 | 9/2002 | Jeong et al. |
| 6,445,059 B1 | 9/2002 | Yamazaki |
| 6,461,899 B1 | 10/2002 | Kitakado et al. |
| 6,469,317 B1 | 10/2002 | Yamazaki et al. |
| 6,474,826 B1 | 11/2002 | Tanaka et al. |
| 6,474,827 B2 | 11/2002 | Shinohara et al. |
| 6,486,494 B2 | 11/2002 | Jeong et al. |
| 6,489,222 B2 | 12/2002 | Yoshimoto |
| 6,501,098 B2 | 12/2002 | Yamazaki |
| 6,505,946 B2 | 1/2003 | Suzuki et al. |
| 6,524,877 B1 | 2/2003 | Nakazawa et al. |
| 6,530,671 B2 | 3/2003 | Taniguchi et al. |
| 6,556,265 B1 | 4/2003 | Murade |
| 6,567,146 B2 | 5/2003 | Hirakata et al. |
| 6,570,182 B2 | 5/2003 | Jeong et al. |
| 6,582,982 B2 | 6/2003 | Jeong et al. |
| 6,608,353 B2 | 8/2003 | Miyazaki et al. |
| 6,609,809 B2 | 8/2003 | Ohkawa |
| RE38,292 E | 10/2003 | Satou |
| 6,630,687 B1 | 10/2003 | Koyama et al. |
| 6,676,268 B2 | 1/2004 | Ohkawa et al. |
| 6,686,606 B2 | 2/2004 | Jeong et al. |
| 6,693,681 B1 | 2/2004 | Takemura |
| 6,756,740 B2 | 6/2004 | Inukai |
| 6,762,813 B1 | 7/2004 | Zhang et al. |
| 6,765,562 B2 | 7/2004 | Yamazaki et al. |
| 6,787,887 B2 | 9/2004 | Yamazaki |
| 6,789,910 B2 | 9/2004 | Kimura et al. |
| 6,825,488 B2 | 11/2004 | Yamazaki et al. |
| 6,946,681 B2 | 9/2005 | Jeong et al. |
| RE38,901 E | 11/2005 | Park et al. |
| 6,977,394 B2 | 12/2005 | Yamazaki et al. |
| 6,982,768 B2 | 1/2006 | Ohori et al. |
| 6,998,282 B1 | 2/2006 | Yamazaki et al. |
| 7,023,502 B2 | 4/2006 | Zhang et al. |
| 7,034,335 B2 | 4/2006 | Fujikawa et al. |
| 7,034,381 B2 | 4/2006 | Yamazaki |
| 7,046,313 B2 | 5/2006 | Zhang et al. |

(56) References Cited

U.S. PATENT DOCUMENTS

| | | |
|---|---|---|
| 7,064,388 B2 | 6/2006 | Hayakawa et al. |
| 7,088,333 B1 | 8/2006 | Manabe et al. |
| 7,102,169 B2 | 9/2006 | Koyama et al. |
| 7,126,161 B2 | 10/2006 | Yamazaki |
| 7,202,551 B2 | 4/2007 | Yamazaki |
| 7,268,777 B2 | 9/2007 | Yamazaki et al. |
| 7,323,717 B2 | 1/2008 | Koyama et al. |
| 7,333,169 B2 | 2/2008 | Zhang et al. |
| 7,413,937 B2 | 8/2008 | Yamazaki |
| 7,425,931 B1 | 9/2008 | Yamazaki et al. |
| 7,489,291 B2 | 2/2009 | Yamazaki et al. |
| 7,492,346 B2 | 2/2009 | Manabe et al. |
| 7,532,208 B2 | 5/2009 | Yamazaki et al. |
| 7,550,325 B2 | 6/2009 | Koyama et al. |
| 8,144,088 B2 | 3/2012 | Manabe et al. |
| 8,487,315 B2 | 7/2013 | Kimura et al. |
| 8,829,529 B2 * | 9/2014 | Kimura et al. ............ 257/72 |
| 2001/0025959 A1 | 10/2001 | Yamazaki et al. |
| 2002/0008797 A1 | 1/2002 | Yamazaki et al. |
| 2002/0013021 A1 | 1/2002 | Jeong et al. |
| 2002/0044230 A1 | 4/2002 | Yamazaki et al. |
| 2002/0060323 A1 | 5/2002 | Jeong et al. |
| 2002/0110941 A1 | 8/2002 | Yamazaki et al. |
| 2002/0175395 A1 | 11/2002 | Jeong et al. |
| 2003/0160252 A1 | 8/2003 | Jeong et al. |
| 2003/0207506 A1 | 11/2003 | Satou |
| 2004/0004424 A1 | 1/2004 | Sakurai |
| 2004/0140566 A1 | 7/2004 | Jeong et al. |
| 2005/0082541 A1 | 4/2005 | Satou |
| 2005/0084999 A1 | 4/2005 | Satou |
| 2005/0104071 A1 | 5/2005 | Satou |
| 2005/0162421 A1 | 7/2005 | Yamazaki et al. |
| 2005/0162578 A1 | 7/2005 | Yamazaki et al. |
| 2005/0233509 A1 | 10/2005 | Satou |
| 2006/0192201 A1 | 8/2006 | Zhang et al. |
| 2008/0106656 A1 | 5/2008 | Zhang et al. |
| 2008/0309585 A1 | 12/2008 | Yamazaki et al. |
| 2009/0015534 A1 | 1/2009 | Zhang |
| 2009/0195523 A1 | 8/2009 | Yamazaki et al. |
| 2009/0231533 A1 | 9/2009 | Koyama et al. |
| 2011/0169011 A1 | 7/2011 | Yamazaki et al. |

FOREIGN PATENT DOCUMENTS

| | | |
|---|---|---|
| EP | 0762184 A | 3/1997 |
| EP | 0800036 A | 10/1997 |
| EP | 0969311 A | 1/2000 |
| EP | 1001467 A | 5/2000 |
| EP | 1028469 A | 8/2000 |
| EP | 1058310 A | 12/2000 |
| EP | 1058484 A | 12/2000 |
| EP | 1265096 A | 12/2002 |
| EP | 1538676 A | 6/2005 |
| JP | 60-235468 A | 11/1985 |
| JP | 64-059215 A | 3/1989 |
| JP | 01-101519 A | 4/1989 |
| JP | 04-307521 A | 10/1992 |
| JP | 04-313729 A | 11/1992 |
| JP | 05-053127 A | 3/1993 |
| JP | 05-210090 A | 8/1993 |
| JP | 05-241200 A | 9/1993 |
| JP | 06-034996 A | 2/1994 |
| JP | 06-067210 A | 3/1994 |
| JP | 06-138488 A | 5/1994 |
| JP | 06-148685 A | 5/1994 |
| JP | 06-160904 A | 6/1994 |
| JP | 06-167722 A | 6/1994 |
| JP | 06-194689 A | 7/1994 |
| JP | 06-060830 A | 8/1994 |
| JP | 06-060830 U | 8/1994 |
| JP | 06-250221 A | 9/1994 |
| JP | 07-130652 A | 5/1995 |
| JP | 07-135323 A | 5/1995 |
| JP | 07-175038 A | 7/1995 |
| JP | 07-176794 A | 7/1995 |
| JP | 07-235680 A | 9/1995 |
| JP | 07-294870 A | 11/1995 |
| JP | 07-320514 A | 12/1995 |
| JP | 08-240816 A | 9/1996 |
| JP | 08-274336 A | 10/1996 |
| JP | 08-330602 A | 12/1996 |
| JP | 09-113730 A | 5/1997 |
| JP | 09-129890 A | 5/1997 |
| JP | 09-138387 A | 5/1997 |
| JP | 09-160509 A | 6/1997 |
| JP | 09-223804 A | 8/1997 |
| JP | 09-325221 A | 12/1997 |
| JP | 10-048640 A | 2/1998 |
| JP | 10-078593 A | 3/1998 |
| JP | 10-096962 A | 4/1998 |
| JP | 10-104663 A | 4/1998 |
| JP | 10-153796 A | 6/1998 |
| JP | 10-161123 A | 6/1998 |
| JP | 10-189252 A | 7/1998 |
| JP | 10-198292 A | 7/1998 |
| JP | 10-199318 A | 7/1998 |
| JP | 10-223021 A | 8/1998 |
| JP | 10-247412 A | 9/1998 |
| JP | 10-253989 A | 9/1998 |
| JP | 10-255530 A | 9/1998 |
| JP | 10-270363 A | 10/1998 |
| JP | 10-283817 A | 10/1998 |
| JP | 11-002836 A | 1/1999 |
| JP | 11-097698 A | 4/1999 |
| JP | 11-133425 A | 5/1999 |
| JP | 11-164386 A | 7/1999 |
| JP | 11-175009 A | 7/1999 |
| JP | 11-183936 A | 7/1999 |
| JP | 11-218760 A | 8/1999 |
| JP | 11-231320 A | 8/1999 |
| JP | 11-238408 A | 8/1999 |
| JP | 11-282011 A | 10/1999 |
| JP | 11-282012 A | 10/1999 |
| JP | 11-306831 A | 11/1999 |
| JP | 11-339527 A | 12/1999 |
| JP | 2000-010120 A | 1/2000 |
| JP | 2000-011723 A | 1/2000 |
| JP | 2000-029024 A | 1/2000 |
| JP | 2000-089031 A | 3/2000 |
| JP | 2000-260217 A | 9/2000 |
| JP | 2000-268621 A | 9/2000 |
| JP | 2000-331523 A | 11/2000 |
| JP | 2001-143512 A | 5/2001 |
| JP | 2001-357714 A | 12/2001 |
| JP | 2002-056713 A | 2/2002 |
| JP | 2002-296425 A | 10/2002 |
| JP | 2004-273204 A | 9/2004 |
| KR | 1999-0025891 A | 4/1999 |
| KR | 1999-0063412 A | 7/1999 |
| KR | 1999-0065725 A | 8/1999 |
| KR | 1999-0076545 A | 10/1999 |
| KR | 1999-0080392 A | 11/1999 |
| KR | 1999-0084732 A | 12/1999 |
| KR | 1999-0087841 A | 12/1999 |
| KR | 1999-0088600 A | 12/1999 |
| WO | WO-97/13177 | 4/1997 |

* cited by examiner

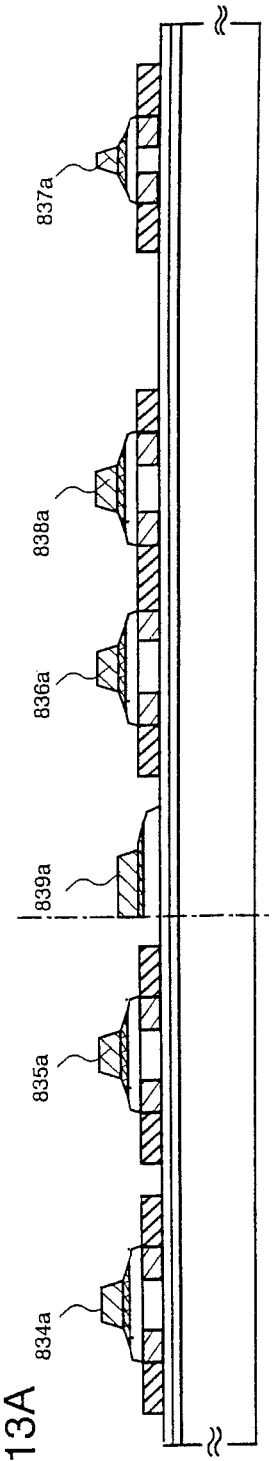
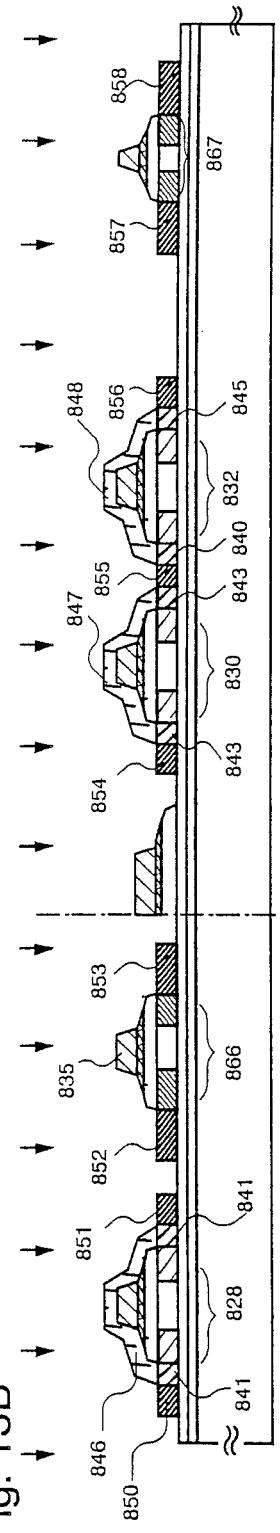
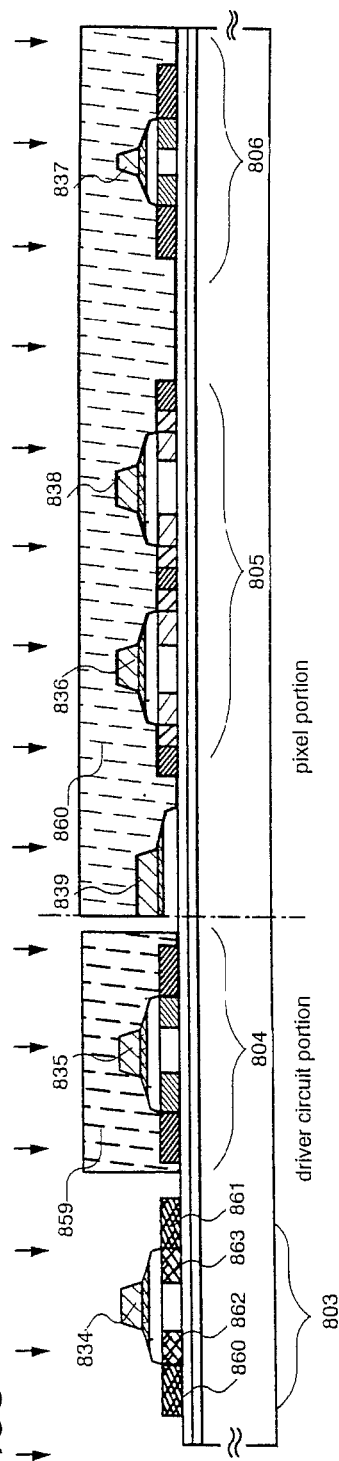
Fig. 13A
Fig. 13B
Fig. 13C

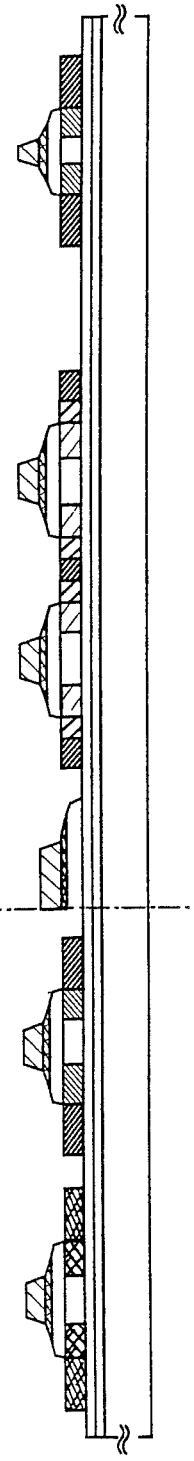
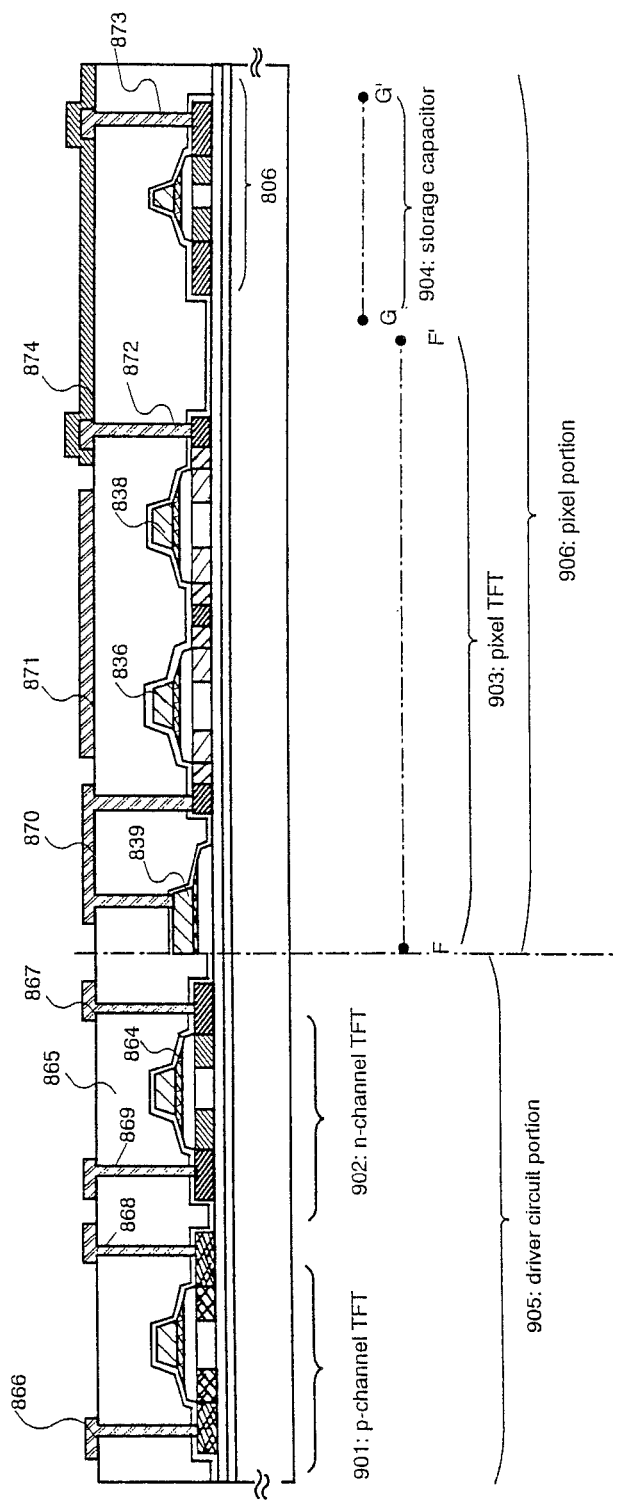
Fig. 14A
Fig. 14B

SEMICONDUCTOR DEVICE

CROSS-REFERENCE TO RELATED APPLICATIONS

This application is a continuation of U.S. application Ser. No. 13/940,475, filed Jul. 12, 2013, now U.S. Pat. No. 8,829,529, which continuation of U.S. application Ser. No. 13/276,367, filed Oct. 19, 2011, now U.S. Pat. No. 8,487,315, which is a divisional of U.S. application Ser. No. 12/552,303, filed Sep. 2, 2009, now U.S. Pat. No. 8,042,984, which is a divisional of U.S. application Ser. No. 11/690,190, filed Mar. 23, 2007, now U.S. Pat. No. 7,594,743, which is a continuation of U.S. application Ser. No. 10/932,022, filed Sep. 2, 2004, now U.S. Pat. No. 7,204,635, which is a continuation of U.S. application Ser. No. 09/833,397, filed Apr. 11, 2001, now U.S. Pat. No. 6,789,910, which claims the benefit of a foreign priority application filed in Japan as Serial No. 2000-111345 on Apr. 12, 2000, all of which are incorporated by reference.

BACKGROUND OF THE INVENTION

1. Field of the Invention

The present invention relates to an illumination apparatus for illuminating an image display plane of a liquid crystal display device, and more specifically, relates to a scheme intended to realize a uniform in-plane brightness of the illumination apparatus in a method for converting a point light source into a plane light source. By means of the present invention, an illumination apparatus capable of emitting light as a plane light source with no unevenness in brightness can be realized even when a point light source is employed. In addition, by means of the present invention, an illumination apparatus capable of emitting light as a plane light source with less unevenness in brightness can be realized even when the small number of point light sources is employed.

2. Description of the Related Art

A liquid crystal electro-optical device is widely used in view of advantages of low power consumption, light weight, and a small thickness. The liquid crystal electro-optical device includes a direct-view type liquid crystal electro-optical device and a projection-type liquid crystal electro-optical device. In the case of a direct-view and transmission type liquid crystal electro-optical device, a viewer recognizes an image by means of a back light. In the case of a direct-view and reflection type liquid crystal electro-optical device, a viewer recognizes an image by means of a front light.

FIG. 22 shows a perspective view of an edge-light type back light in which light sources are disposed at side surfaces of a plate-like light guiding plate. More specifically, the light sources 104, each of which is a line light source such as a cold cathode fluorescent tube or the like, are provided at two opposite side surfaces of the plate-like light guiding plate 105. Light incident onto the plate-like light guiding plate 105 is scattered by means of ink dots 106 formed on a rear surface of the plate-like light guiding plane to emit toward a transmission type liquid crystal electro-optical device 101. A prism sheet 103 may be used over the plate-like light guiding plate in order to enhance brightness in the front direction. Light emitted from the plate-like light guiding plate and provided with directionality by means of the prism sheet is incident on a diffusion plate 102 so that the in-plane brightness distribution can become uniform by means of the diffusion plate. Light scattered by the ink dots and leaked downward from the plate-like light guiding plate is reflected by reflecting plate 107 to travel back toward the liquid crystal electro-optical device 101.

Thus, the illumination apparatus such as a back light is provided with a plate-like light guiding plate disposed below a display region of a liquid crystal electro-optical device, and further provided with line light sources disposed at the side surfaces of the plate-like light guiding plate. Light emitted from the light sources repeats total reflections within the plate-like light guiding plate to be expanded over the entire region of the plate-like light guiding plate. FIGS. 20A and 20B respectively show cross-sectional views of the plate-like light guiding plate in the thickness direction thereof, illustrating different manners of light propagation in the plate-like light guiding plate. It should be noted that six surfaces are defined for the plate-shaped light guiding plate as shown in a perspective view of FIG. 19A, in order to explain the light propagation. More specifically, a surface closer to a viewer is referred to as an upper surface 735, while a surface opposite to the upper surface is referred to as a lower surface 736. A side surface onto which a light emitted from a light source 737 is incident is referred to as an end surface 738. Each of surfaces perpendicular to the end surface is referred to as a side surface 739. The last surface is a surface 740, which is parallel to the end surface.

FIG. 20A illustrates the light propagation in the case where light is incident along the end surface 109 of the plate-like light guiding plate having the refractive index of 1.49 from the air 112 having the refractive index of 1. The light incident along the end surface of the plate-like light guiding plate is refracted in accordance with the Snell's law to be propagated at the angle of 42° with respect to the normal direction of the end surface of the plate-like light guiding plate, and is then incident on the lower surface 110 of the plate-like light guiding plate at the angle of 48° which exceeds the critical angle, thereby being totally reflected. Thereafter, the light is incident on the upper surface 111 of the plate-like light guiding plate at the angle of 48° to be totally reflected. Thus, the light repeats the total reflections at the upper surface 111 of the plate-like light guiding plate and the lower surface of the plate-like light guiding plate. FIG. 20B illustrates the light propagation in the case where light is incident at the angle ($\theta_1$) smaller than 90° with respect to the normal direction of the end surface 109 of the plate-like light guiding plate 105 having the refractive index of 1.49 from the air having the refractive index of 1. The light entering the plate-like light guiding plate is incident on the upper surface 111 of the plate-like light guiding plate and the lower surface 110 of the plate-like light guiding plate at the angle ($\theta_2$), which exceeds the critical angle. Thus, the light repeats the total reflections at the upper surface of the plate-like light guiding plate and the lower surface of the plate-like light guiding plate, thereby resulting in the light being emitted from the surface parallel to the end surface 109 while being inclined at the angle of $\theta_1$ with respect to the normal direction of this surface.

Thus, the light incident on the end surface 109 of the plate-like light guiding plate at any angle is entirely totally reflected within the plate-like light guiding plate. Accordingly, no light is allowed to emit through the upper surface of the plate-like light guiding plate or the lower surface of the plate-like light guiding plate, so long as no structural member is provided at the upper or lower surface of the plate-like light guiding plate. In addition, as calculated from the Snell's law, the light incident from the air onto the end surface of the plate-like light guiding plate at any angle is refracted at the interface between the air and the end surface of the plate-like light guiding plate, so that the light propagating within the plate-like light guiding plate is inclined with respect to the normal direction of the end surface of the plate-like light guiding plate at 42° or less.

In the case where it is desired to emit the light through the upper surface of the plate-like light guiding plate, white-colored ink dots may be provided at the lower surface of the plate-like light guiding plate. FIG. 23 illustrates a cross-sectional view of an edge-light type back light. Like reference numerals designate like components both in FIGS. 22 and 23. A light source 104 is provided in the vicinity of an end surface 109 of the plate-like light guiding plate, and a lamp reflector 108 is formed around the light source. Light emitted from the light source and light reflected from the lamp reflector are allowed to enter a plate-like light guiding plate through the end surface of the plate-like light guiding plate 105. The light is incident on the upper surface 111 of the plate-like light guiding plate and the lower surface 110 of the plate-n like light guiding plate to be totally reflected within the plate-like light guiding plate. However, since the white-colored ink dots 106 are printed on the lower surface of the plate-like light guiding plate, the light incident onto the ink dots 106 is scattered due to the shape or the refractive index of the ink dots. When the light is thus scattered by the ink dot and is allowed to be incident on the upper surface 111 of the plate-like light guiding plate at the angle smaller than the critical angle, the light is allowed to exit from the plate-like light guiding plate. Thus, by optimizing the size, the pitch and the density of the ink dots, the in-plane brightness of the light exiting the plate-like light guiding plate can be made uniform.

The illumination apparatus in which the light is emitted through the lower surface of the plate-like light guiding plate can be applied to a front light of a reflection type liquid crystal electro-optical device. In the case of the direct-view and reflection type liquid crystal electro-optical device, a display region of the reflection type liquid crystal electro-optical device is irradiated with the illumination from the front light, so that a viewer can recognize an image. The front light is lit under the small amount of external light so that the image can be easily viewed.

FIG. 24A illustrates a cross-sectional view of a prism-type front light as one example of the front light. A plate-like light guiding plate 202 provided with a prism surface on its upper surface is formed over a display region of a reflection type liquid crystal electro-optical device 201. Adjacent to an end surface 213 of the plate-like light guiding plate, a light source 203 is disposed. In order to effectively guide the light emitted from the light source toward the end surface of the plate-like light guiding plate, a lamp reflector 204 is provided. A cross-sectional view in FIG. 24B illustrates an operation of the prism-type front light when the light is off. When the light source is off, external light 205 passes through the plate-like light guiding plate 202 and is then reflected from the reflection type liquid crystal electro-optical device 201, so that the reflected light containing the image information is emitted toward the viewer. On the other hand, a cross-sectional view in FIG. 24C illustrates an operation of the prism-type front light when the light is on. When the light source 203 is on, light 206 emitted from the light source 203 is reflected from the lamp reflector 204 to be incident on the end surface 213 of the plate-like light guiding plate 202. The light 206 incident on the plate-like light guiding plate 202 is then surface-reflected at a side surface of the prism to be incident on the reflection type liquid crystal electro-optical device 201. The light reflected from the reflection type liquid crystal electro-optical device 201 is incident on the interface between the plate-like light guiding plate and the air at the angle smaller than the critical angle, thereby being allowed to exit from the plate-like light guiding plate.

In an alternative embodiment mode of the front light of the reflection type liquid crystal electro-optical device, projections may be provided on the lower surface of the plate-like light guiding plate. FIG. 25A illustrates a cross-sectional view of the projection-shape front light. On a lower surface of a plate-like light guiding plate 207, projections 208 each having a rectangular cross-section are formed. The shape of the projections is not limited to a rectangular shape, but may be corrugated. In order to effectively guide the light emitted from a light source 209 toward an end surface of the plate-like light guiding plate, a lamp reflector 210 is provided. A reflection type liquid crystal electro-optical device 212 is disposed below the plate-like light guiding plate. A cross-sectional view in FIG. 25B illustrates an operation of the projection-shape front light when the light is off. When the light source is off, the external light 211 passes through the plate-like light guiding plate 207 and is then reflected from the reflection type liquid crystal electro-optical device 212 to be emitted toward the viewer. On the other hand, a cross-sectional view in FIG. 25C illustrates an operation of the projection-shape front light when the light is on. When the light source 209 is on, the light 213 emitted from the light source 209 is reflected from the lamp reflector 210 to be incident on the end surface 207 of the plate-like light guiding plate. When the light incident on the end surface of the plate-like light guiding plate propagates within the plate-like light guiding plate to be incident on a bottom surface of the projection 208 formed on the lower surface of the plate-like light guiding plate, the light is totally reflected so as to propagate within the plate-like light guiding plate. When the light is incident on a side surface of the projection 208, the total-reflection condition of the light is not met so that the light is refracted at the side surface. Most of the thus refracted light is incident on the reflection type liquid crystal electro-optical device, so that the reflected light containing, the image information is allowed to emit toward the viewer. Thus, in the projection-shape front light, the total-reflection condition is not met for the light incident on the side surface of the projection provided on the lower surface of the plate-like light guiding plate, so that the light is incident on the reflection type liquid crystal electro-optical device. In order to allow the light to be uniformly incident on the reflection type liquid crystal electro-optical device, the projections are formed at a lower density in the vicinity of the light source while at a higher density as further away from the light source.

Since the liquid crystal electro-optical device is of the non-emission type, the device is used by projecting light thereto from a back light or a front light in order to improve the visibility of a display. As a light source of the back light or the front light, a cold cathode fluorescent tube is generally used. However, when the cold cathode fluorescent tube is used as the light source, most of power consumption of the liquid crystal display device is derived from the back light or the front light. In order to reduce the power consumption of the liquid crystal display device, a light emitting diode (LED) is recently used as the light source instead of the cold cathode fluorescent tube. Use of the light emitting diode can suppress the power consumption to a fraction of that necessary when the cold cathode fluorescent tube is used.

Since the light emitting diode is a point light source, it can have the size of about 1 mm×1 mm and the thickness of about 2 to 3 mm. In order to reduce the size of the liquid crystal display device, the light emitting diode can be employed. Since the light emitting diode is a point light source, means for converting such a point light source into a plane-like light source having a high uniformity of in-line brightness is required.

In an attempt where a point light source such as a light emitting diode is converted into a plane light source so as to obtain a uniform lightness in a large area, unevenness in the brightness cannot be avoided. In an example for converting the point light source into the plane light source, as shown in a top plan view of FIG. 21 in which a plurality of point light sources 301 to 303 such as a light emitting diode are disposed on a side surface of a plate-like light guiding plate 304, light incident from the point light sources onto the plate-like light guiding plate is expanded in a plane within the plate-like light guiding plate. However, even when a plurality of point light sources are disposed on the side surface of the plate-like light guiding plate, these point light sources can not be converted into a uniform plane light source. As previously explained, when an acrylic resin is used for the plate-like light guiding plate, light is incident from the air having the refractive index of 1 onto the acrylic resin having the refractive index of 1.49, and therefore, refraction occurs due to a difference in refractive indices of the involved materials. As can be calculated from the Snell's law, the light refracted at the interface between the air and the plate-like light guiding plate is expanded only up to the maximum angle ($\theta_A$) of 42° with respect to the normal direction of the incident surface of the plate-like light guiding plate. Thus, even when the light emitted from the point light sources is incident on the plate-like light guiding plate, the light is expanded only over certain regions of the plate-like light guiding plate while the light is not expanded to some regions 305 therein. In the case where the illumination light is employed as a front light or a back light for a liquid crystal electro-optical device, the brightness on an image area has to be uniform. With a large unevenness in the brightness, the visibility is significantly damaged. Even when a diffusion plate is provided between the point light sources 301 to 303, such as light emitting diodes, and the plate-like light guiding plate 304, uniformity in the diffused light is not satisfactory so that in-plane unevenness in the brightness is induced for the illumination light emitted from the back light or the front light.

An example of an illumination apparatus in which one point light source and a plate-like light guiding plate are employed is described, for example, in Japanese Laid-Open Patent Publication No. 10-199318. In this illumination apparatus, a point light source is disposed at the center portion of a side surface of the plate-like light guiding plate. More specifically, as shown in a plan view of FIG. 31, the illumination apparatus includes only a plate-like light guiding plate 304 and a point light source 307 at the center portion of a side surface of the plate-like light guiding plate, and therefore, the light of the point light source expanded within the plate-like light guiding plate can not spread over the entire display region, so that corner areas 306 of the display region become dark.

Means for converting a point light source into a plane light source is desirably means for obtaining a bright plane light source having a satisfactory uniform in-plane brightness. In addition, it is preferable to miniaturize an illumination apparatus for converting the point light source into the plane light source as much as possible. Furthermore, it is also preferable to determine the shape of the light guiding plate and a position at which the point light source is to be disposed on the light guiding plate in light of the light usage efficiency.

SUMMARY OF THE INVENTION

In order to explain means for solving the problems, six surfaces are defined for the plate-shaped light guiding plate as shown in a perspective view of FIG. 19A. More specifically, a surface closer to a viewer is referred to as an upper surface 735, while a surface opposite to the upper surface is referred to as a lower surface 736. A side surface onto which a light emitted from a light source 737 is incident is referred to as an end surface 738. Each of surfaces perpendicular to the end surface is referred to as a side surface 739. The last surface is a surface 740, which is parallel to the end surface. The following descriptions with reference to FIGS. 1, 2A to 2C, and 3A to 3C are based on the above definitions.

In accordance with the present invention, a point light source is converted into a line light source by means of a linear light guiding plate, and further into a plane light source by means of a plane-like light guiding plate. Thus, the plane light source having less unevenness in the brightness can be formed even when a point light source is employed.

The present invention will be explained with reference to FIGS. 1, 2A to 2C, and 3A to 3C. A perspective view in FIG. 1 illustrates an illumination apparatus in accordance with the present invention, and perspective views of FIGS. 2A to 2C indicate cut-away views for explaining the light propagation in the illumination apparatus in accordance with the present invention. Furthermore, cross-sectional views of FIGS. 3A to 3C illustrate the path of light propagating in the illumination apparatus in accordance with the present invention. Elements in FIG. 1 are the same as those in FIGS. 2A to 2C. In addition, like reference numerals indicate like components in FIG. 1 and FIGS. 3A to 3C.

In FIG. 1, a line light source is composed of a light emitting diode 401, a lamp reflector 402, a linear light guiding plate 403, and ink dots 404. There exist a reflecting plate 405, a reflecting plate 408 and a reflecting plate 415 around the linear light guiding plate 403. Although not illustrated, additional reflecting plate may be provided so as to face a surface parallel to an end surface of the linear light guiding plate. Light emitted from the light emitting diode is converted into the line light source by the linear light guiding plate and then is incident onto a plate-like light guiding plate 406 to be converted into a plane light source. The ink dots 407 are formed on a lower surface of the plate-like light guiding plate. The reflecting plate 408 is provided below the plate-like light guiding plate for reflecting the light scattered by the ink dots 407 beneath the plate-like light guiding plate toward a viewer.

The light propagation will be described in detail below with reference to FIGS. 3A to 3C. FIG. 3A illustrates a cross-sectional view obtained by cutting with a plane (chain line A-A' in FIG. 2A) perpendicular to the side surface of the plate-like light guiding plate and parallel to the upper surface thereof. FIG. 3B illustrates a cross-sectional view obtained by cutting with a plane (chain line B-B' in FIG. 2B) perpendicular to the end surface of the linear light guiding plate and perpendicular to the upper surface of the linear light guiding plate. FIG. 3C illustrates a cross-sectional view obtained by cutting with a plane (chain line C-C' in FIG. 2C) perpendicular to the upper surface of the plate-like light guiding plate and parallel to the side surface thereof.

The cross-sectional view of FIG. 3A illustrates the light propagation viewed from the above of the plate-like light guiding plate and the linear light guiding plate. Light emitted from the light emitting diode 401 is reflected at the lamp reflector 402. The light emitted from the light emitting diode and the light reflected from the lamp reflector go into the inside of the linear light guiding plate 403 through the end surface 429 thereof, and propagate within the linear light guiding plate 403 while repeating the total reflections therein. When the light is incident on the ink dots 404 formed on the side surface 430 in the longitudinal direction of the linear light guiding plate 403, the light is scattered by the ink dots so that the light is emitted from the linear light guiding plate toward the end surface 411 of the plate-like light guiding plate 406. It is preferable that the ink dots 404 are formed at a low density in a region closer to the light emitting diode while being formed at a high density in a region further away from the light emitting diode, so that the light can be uniformly emitted through the side surface 431 (the light emitting surface) of the linear light guiding plate 403.

In order to effectively utilize the light scattered toward the outside of the linear light guiding plate by the ink dots, the reflecting plate 405 is disposed at a rear position of the side surface on which the ink dots are formed. It should be noted that the reflecting plate 405 should not be attached closely to the linear light guiding plate 403. In other words, the linear light guiding plate 403 is required to contact the air. This is because the light entering the linear light guiding plate is required to travel in the inside of the linear light guiding plate while repeating the total reflections therein. The reflectance of the total reflection is almost 100%, and therefore, there is no energy loss involved. On the other hand, in the case where light is reflected on a metal surface such as silver or the like, the reflectance is about 90%. When light is reflected at the metal surface, a small amount of current flows in the metal and the current is then converted into heat, which results in an energy loss. Accordingly, when light is repeatedly reflected at the metal surface, a significant loss of energy is generated. In view of the above, the light is required to propagate while repeating the total reflections within the linear light guiding plate, and therefore, the reflecting plate 405 is disposed so as not to closely contact the linear light guiding plate.

In FIG. 3A, light is incident on the end surface 411 of the plate-like light guiding plate 406 at an arbitrary angle. Since the light is totally reflected at the side surfaces 409 and 410 of the plate-like light guiding plate which are perpendicular to the end surface of the plate-like light guiding plate 406 irrespective of the angle at which the light is incident on the end surface 411 of the plate-like light guiding plate 406, almost no light is emitted from the side surfaces 409 and 410 of the plate-like light guiding plate. This is because no structural member such as a prism, a projection, an ink dot or the like is provided on the side surfaces 409 and 410 of the plate-like light guiding plate which will break the condition for the total reflection of light. In FIG. 3A, the light which repeats the total reflections at the side surfaces 409 and 410 of the plate-like light guiding plate is allowed to be emitted through the surface 412 parallel to the end surface of the plate-like light guiding plate in theory. However, the light in actual propagates three-dimensionally in the plate-like light guiding plate, and therefore, is emitted toward a viewer by the ink dots formed on the lower surface of the plate-like light guiding plate. Thus, the intensity of light is gradually lowered at positions further away from the end surface 411 of the plate-like light guiding plate. Accordingly, only the minute amount of light can reach the surface 412 parallel to the end surface of the plate-like light guiding plate. Almost no light is emitted through the side surfaces 409 and 410 of the plate-like light guiding plate and the surface 412 parallel to the end surface of the plate-like light guiding plate.

The cross-sectional view of FIG. 3B illustrates the light propagation viewed from the side surface of the linear light guiding plate through which the light is allowed to emit. Light emitted from the light emitting diode 401 is reflected at the lamp reflector 402 to be incident on the end surface 429 of the linear light guiding plate. The light incident on the end surface of the linear light guiding plate 403 is totally reflected at the upper surface of the linear light guiding plate and the lower surface of the linear light guiding plate. In other words, no light is basically allowed to emit through the upper surface 413 of the linear light guiding plate and the lower surface 414 of the linear light guiding plate. This is because no structural member such as a prism, a projection, an ink dot is provided on the upper surface 413 of the linear light guiding plate and the lower surface 414 of the linear light guiding plate which will break the condition for the total reflection of light. It should be noted, however, the light scattered by the ink dots 404 shown in FIG. 3A can be emitted through the upper surface 413 of the linear light guiding plate and the lower surface 414 of the linear light guiding plate. Accordingly, it is preferable to provide the reflecting plate 408 or the reflecting plate 415 around the linear light guiding plate in order to effectively use the light 416 leaked through the upper surface of the linear light guiding plate and the lower surface of the linear light guiding plate. In addition, since the light is scattered by the ink dots to be emitted from the linear light guiding plate toward the plate-like light guiding plate, the intensity of light is gradually lowered at positions further away from the end surface of the linear light guiding plate. Only the minute amount of light can reach the surface 417 parallel to the end surface of the linear light guiding plate.

The cross-sectional view of FIG. 3C illustrates the light propagation viewed from the surface parallel to the end surface of the linear light guiding plate and the side surface of the plate-like light guiding plate. Light is scattered by the ink dots 404 provided on the side surface of the linear light guiding plate 403 so that the light is emitted through the side surface 431 (the light emitting surface) of the linear light guiding plate to be incident on the end surface 411 of the plate-like light guiding plate 406. The light scattered by the ink dots is also allowed to emit through the upper surface 413 of the linear light guiding plate and the lower surface 414 of the linear light guiding plate. Accordingly, the reflecting plate 415 is provided over the linear light guiding, plate via an air layer and the reflecting plate 408 is provided below the linear light guiding plate via an air layer, so that the light is reflected at these reflecting plates to travel back toward the inside of the linear light guiding plate. In FIG. 3C, the light incident on the end surface of the plate-like light guiding plate 406 at any angle propagates in the plate-like light guiding plate 406 while repeating the total reflections at the upper surface of the plate-like light guiding plate and the lower surface of the plate-like light guiding plate. It should be noted, however, that when the light is incident on the ink dots 407 formed on the lower surface of the plate-like light guiding plate, the light is scattered by the ink dots to be emitted through the surface which is positioned closer to the viewer (i.e., the upper surface) of the plate-like light guiding plate. In this case, the intensity of light is gradually lowered at positions further away from the end surface 411 of the plate-like light guiding plate. Accordingly, the ink dots 407 formed on the lower surface of the plate-like light guiding plate 406 are provided at a low density at positions closer to the end surface of the plate-like light guiding plate while provided at a high density at positions further away from the end surface of the plate-like light guiding plate, so that the light can be emitted uniformly from the upper surface of the plate-like light guiding plate toward the viewer.

Thus, the point light source such as a light emitting diode is converted into a plane light source. Since the ink dots are formed on the lower surface of the plate-like light guiding plate, the light is emitted through the upper surface of the plate-like light guiding plate. The illumination apparatus having either one of the structures as illustrated in FIG. 1, FIGS. 2A to 2C, or FIGS. 3A to 3C can be employed as a back light of a transmission type liquid crystal electro-optical device, or a back light of a semi-transmission liquid crystal electro-optical device.

As each of the linear light guiding plate and the plate-like light guiding plate, an acrylic resin may be used.

Although the ink dots are described as means for breaking the total reflection condition of light in the linear light guiding plate, the side surface of the linear light guiding plate positioned opposite to the plate-like light guiding plate may be instead formed in a prism-shape. Alternatively, the side surface of the linear light guiding plate positioned closer to the plate-like light guiding plate may be formed in a projection-shape.

In order to employ the present invention as a front light of a liquid crystal electro-optical device, the surface positioned closer to a viewer (i.e., the upper surface) of the plate-like light guiding plate may be formed in a prism-shape, instead of forming the ink dots on the lower surface of the plate-like light guiding plate. Alternatively, the lower surface of the plate-like light guiding plate may be formed in a projection-shape. When the present invention is to be used as a front light of a reflecting electro-optical device, the liquid crystal electro-optical device is disposed below the plate-like light guiding plate.

Alternatively, as means for breaking the total reflection condition of light in the plate-like light guiding plate, a material having a refractive index different from that of the plate-like light guiding plate may be formed. Further alternatively, uneven configuration may be formed on the surface of the plate-like light guiding plate so that the light is adjusted to be incident onto the uneven surface at an angle smaller than the angle required for the total reflection.

Another example of the present invention will be described with reference to a perspective view in FIG. 8. In order to explain the structure of the back light as illustrated in FIG. 8, the surfaces of the plate-like light guiding plate are defined as shown in a perspective view of FIG. 19B. More specifically, a surface closer to a viewer is referred to as an upper surface 741, while a surface opposite to the upper surface is referred to as a lower surface 742. The remaining surfaces are referred to as side surfaces 743.

As illustrated in FIG. 8, a point light source such as a light emitting diode 501 is provided at, at least one of corners formed by touching two of the side surfaces of the plate-like light guiding plate to each other. Light emitted from the point light source such as the light emitting diode or the like is reflected at a lamp reflector 503 formed around the point light source to be incident onto at least two of the side surfaces of the plate-like light guiding plate, thereby resulting in the light traveling to the entire region of the plate-like light guiding plate to be converted into a plane light source. Ink dots 504 are formed on a lower surface of the plate-like light guiding plate so that the light incident on the plate-like light guiding plate is uniformly scattered toward a viewer. The light scattered toward the lower rear direction of the plate-like light guiding plate by the ink dots 504 is reflected by a reflecting plate 505 toward the viewer. In accordance with the present invention, the plane light source can be formed from only one point light source such as a light emitting diode or the like. The present invention can be employed as a back light of a transmission type liquid crystal electro-optical device. FIGS. 9A to 9C illustrate cross-sectional views the light propagation on a surface viewed from a viewer in FIG. 8.

The light propagation will be described with reference to FIGS. 9A to 9C. FIG. 9A illustrates a first region 506 in which the light is expanded over the plate-like light guiding plate in the case where the light emitted from the point light source 501 is incident only on one side surface (a first side surface 513) of the plate-like light guiding plate 502. FIG. 9B illustrates a second region 507 in which the light is expanded over the plate-like light guiding plate 502 in the case where the light emitted from the point light source 501 is incident only on another side surface (a second side surface 514) adjacent to the first side surface. As previously described with reference to FIGS. 20A and 20B, the light incident from the air onto the side surface of the plate-like light guiding plate is expanded within the plate-like light guiding plate, as can be calculated from the Snell's law by assuming that the refractive index of the air is 1 and that of the plate-like light guiding plate is 1.49. However, the region over which the light is to be expanded is defined by the maximum angle of 42° with respect to the normal direction of the side surface of the plate-like light guiding plate on which the light is incident. Thus, as shown in FIGS. 9A and 9B, in the case where the light is incident through only one side surface of the plate-like light guiding plate, there exist a region over which the light can be expanded and another region over which the light can not be expanded.

On the other hand, as shown in FIG. 9C, in accordance with the present invention, light is emitted from the light emitting diode 501. The light emitted from the light emitting diode 501 is incident onto a corner of the plate-like light guiding plate 502 and at least two side surfaces (the first side surface and the second side surface) of the plate-like light guiding plate 502 into the inside of the plate-like light guiding plate. Thus, by combining the regions over which the light entering through the two side surfaces can be expanded, i.e., the first region 506 over which the light can be expanded over the plate-like light guiding plate and the second region 507 over which the light can be expanded over the plate-like light guiding plate, the light can be expanded over the entire region of the plate-like light guiding plate.

As illustrated in FIG. 8, the ink dots 504 are printed on the lower surface of the plate-like light guiding plate 502. When the light traveling in the plate-like light guiding plate 502 while repeating the total reflections is incident on the ink dot, the total reflection condition of the light is broken by the ink dot 504 so that the light is emitted toward a viewer. It is preferable that the ink dots are formed at a higher density at positions further away from the light source. Moreover, it is preferable to reduce the density of the ink dots in a third region in which the first region 506 over which the light can be expanded over the plate-like light guiding plate and the second region 507 over which the light can be expanded over the plate-like light guiding plate in FIG. 9C are overlapped with each other.

Although the light emitting diode has been described as the point light source, application of the present invention is not limited to the light emitting diode. The present invention can be widely employed as means for converting a point light source into a plane light source. The plate-like light guiding plate in accordance with the present invention may have a shape such as a rectangular parallelepiped which has satisfactory workability. Thus, a back light can be produced at a low cost.

In the present specification, a point light source is referred to as a light source, as shown in a plan view of FIG. 26, in which when an illumination surface 701 of light emitted from a light source 702 is divided by axes 703 to 706 in orthogonal two directions, the brightness distribution at the division position is such that a brightness distribution 707 of a first axis (aX) 703 is different from a brightness distribution 708 of a second axis (bX) 704 and a brightness distribution 709 of a third axis (aY) 705 orthogonal to the first axis and the second axis is different from a brightness distribution 710 of a fourth axis (bY) 706.

In the present specification, a line light source is referred to as a light source, as shown in a plan view of FIG. 27, in which when an illumination surface 701 is divided by axes 711 to 716 in orthogonal two directions, the brightness distribution at the division position is such that a brightness distribution 717 of a first axis (aX) 711, a brightness distribution 718 of a second axis (bX) 712, and a brightness is distribution 719 of a third axis (cX) 713 are different from each other, while the brightness distribution 720 of a fourth axis (aY) 714 orthogonal to the first through third axes, a brightness distribution 721 of a fifth axis (bY) 715, and a brightness distribution 722 of a sixth axis (cY) 716 become uniform to an extent which causes no practical problem. The term "uniform" means that along the respective axes in the Y direction (i.e., the fourth axis, the fifth axis, and the sixth axis) in the illumination surface, the brightness distribution is within the range of ±5% to ±10% with respect to an average brightness for the same X coordinates.

In the present specification, a plane light source is referred to as a light source, as shown in a plan view of FIG. 28, in which when an illumination surface 701 is divided by axes 723 to 728 in orthogonal two directions, the brightness distribution at the division position is such that a brightness distribution 729 of a first axis (aX) 723, a brightness distribution 730 of a second axis (bX) 724, a brightness distribution 731 of a third axis (cX) 725, the brightness distribution 732 of a fourth axis (aY) 726 orthogonal to the first through third axes, a brightness distribution 733 of a fifth axis (bY) 727, and a brightness distribution 734 of a sixth axis (cY) 728 become uniform to an extent which causes no practical problem. The term "uniform" means that the in-plane brightness distribution is within the range of ±5% to ±10% with respect to an average brightness within the illumination surface.

BRIEF DESCRIPTION OF THE DRAWINGS

In the accompanying drawings:

FIGS. 13A, 13B, and 13C each illustrate a cross-sectional view for explaining fabrication steps of a TFT in a pixel section and in a driver circuit portion in Embodiment 1;

FIGS. 14A and 14B each illustrate a cross-sectional view for explaining fabrication steps of a TFT in a pixel section and in a driver circuit portion in Embodiment 1;

DETAILED DESCRIPTION OF THE PREFERRED EMBODIMENTS

Embodiment Mode 1

In Embodiment Mode 1, the present invention will be applied to a back light of a transmission type liquid crystal electro-optical device. Embodiment Mode 1 will be described with reference to FIG. 1.

Figure 1:
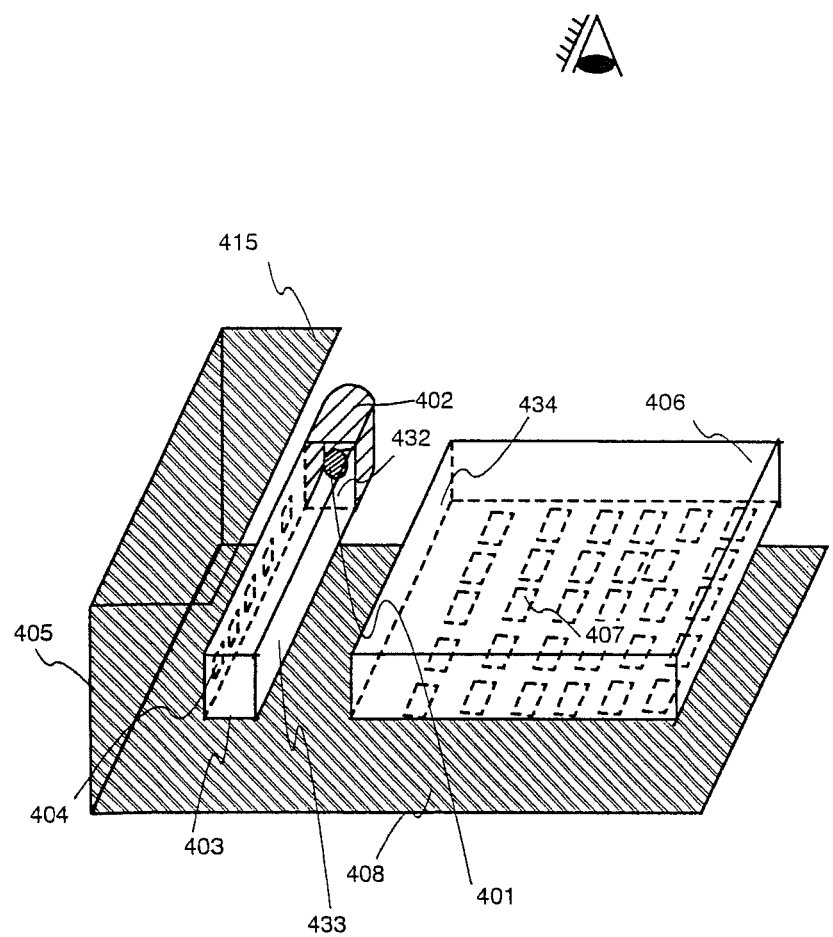
FIG. 1 illustrates a perspective view of a back light in Embodiment Mode 1.
Figure 2A:
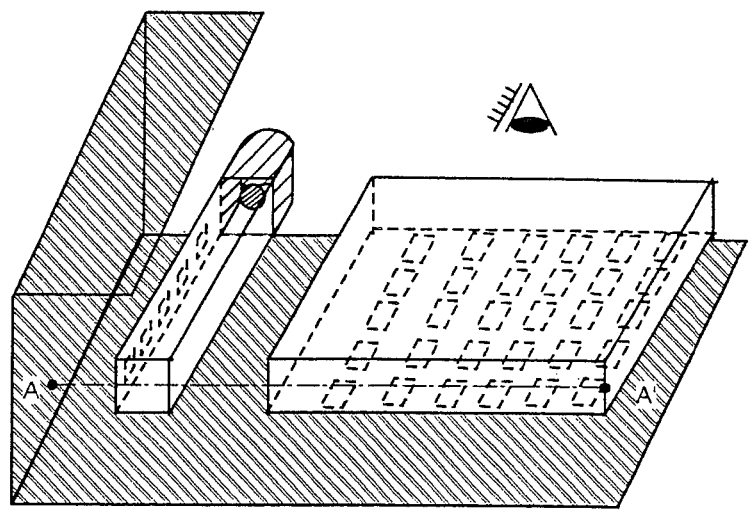
FIGS. 2A, 2B, and 2C each illustrate a perspective view of a back light in accordance with the present invention.
Figure 2B:
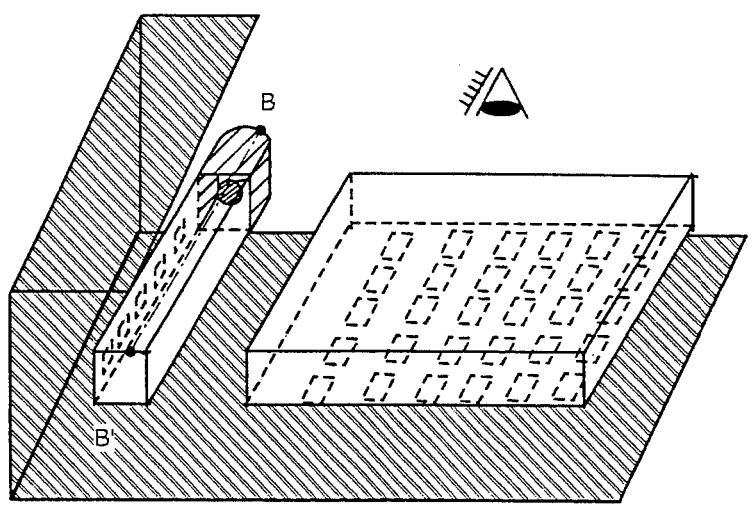
Figure 2C:
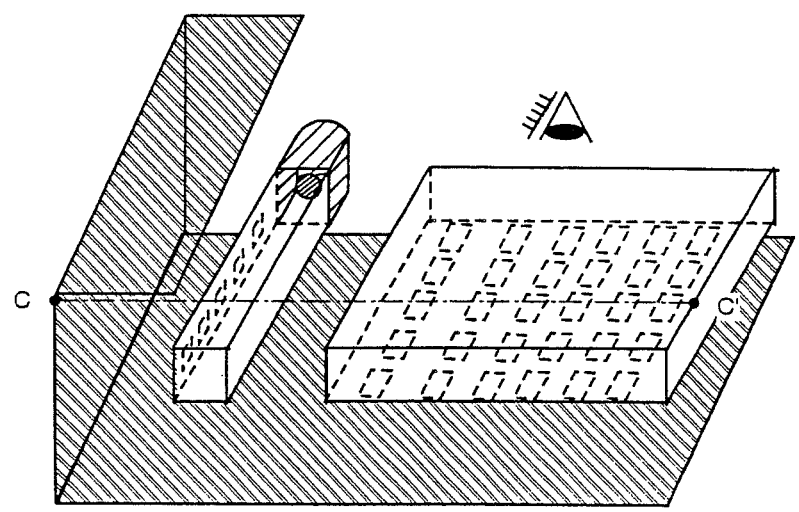
Figure 3A:
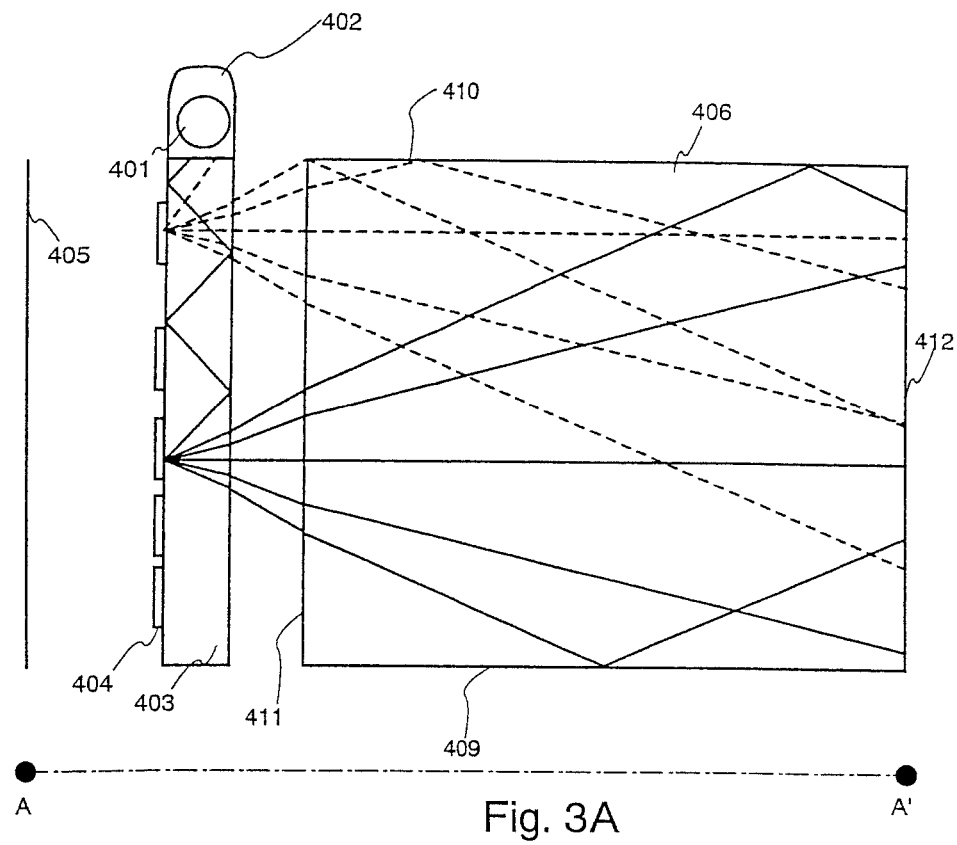
FIGS. 3A, 3B, and 3C each illustrate a cross-sectional view for explaining the light propagation of a back light in accordance with the present invention.
Figure 3B:
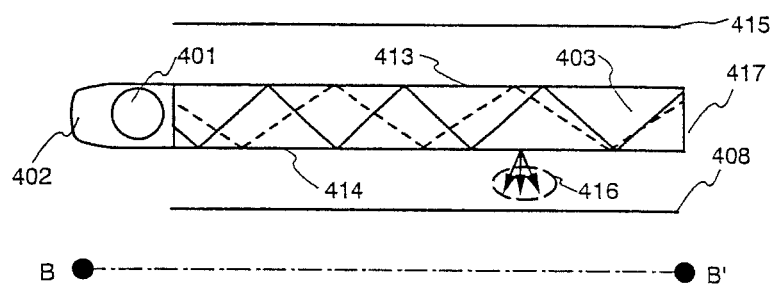
Figure 3C:
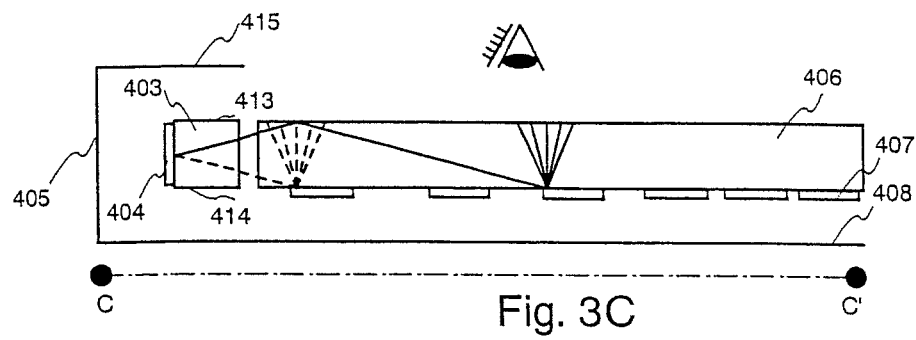
Figure 19A:
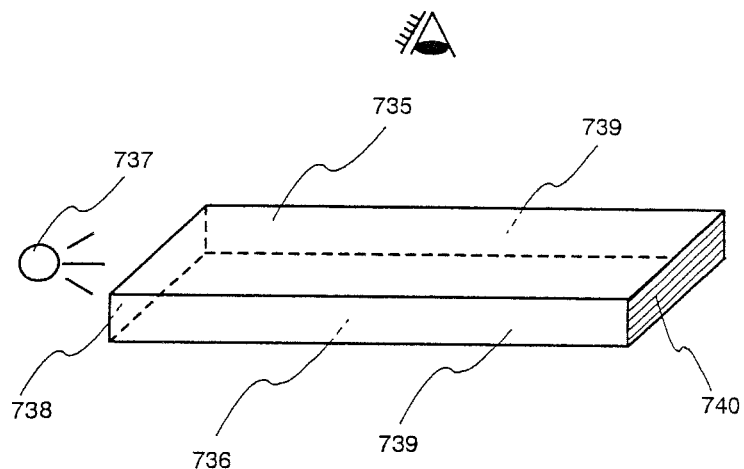
FIGS. 19A and 19B each illustrate a perspective view for defining surfaces of a light guiding plate in accordance with the present invention.

In order to explain Embodiment Mode 1, six surfaces of the light guiding plate are defined as shown in a perspective view of FIG. 19A. More specifically, a surface closer to a viewer is referred to as an upper surface 735. A surface opposite to the upper surface is referred to as a lower surface 736. A surface on which the light emitted from a light source 737 is referred to as an end surface 738. Surfaces perpendicular to the end surface are referred to as side surfaces 739. The other side surface is referred to as a surface 740 parallel to the end surface. The following descriptions with reference to FIG. 1 are based on the above definitions.

A light emitting diode 401 is disposed on a first end surface 432 of a linear light guiding plate (first light guiding plate) 403. The light emitting diode may be disposed at each of opposite ends (both on the first end surface and on a surface parallel to the first end surface) of the linear light guiding plate so that the total number thereof becomes two.

As in a field sequential scheme, in the case where colors of light emitted from the light source of the back light are switched at a high speed to realize a color display, three of the light emitting diodes, i.e., a red-color light emitting diode, a green-color light emitting diode, and a blue-color light emitting diode, are provided. With the field sequential scheme, the colors of the light sources of the back light are switched so as to realize a color display by employing an afterimage effect of human eyes. Thus, no color filter otherwise used in the liquid crystal electro-optical device is required, thereby resulting in a bright display being realized.

In the case where a color display is performed with a color filter in the transmission type liquid crystal electro-optical device a white-color light emitting diode is preferably used as its light source. It should be noted that the white-color light can be obtained alternatively by employing the red, green, and blue light emitting diodes and allowing them to simultaneously emit light while adjusting the color balance among them.

A lamp reflector 402 covers the periphery of the light emitting section of the light emitting diode 401 of the present embodiment mode. Thus, most of the light emitted from the light emitting diode 401 enters the linear light guiding plate 403 through the first end surface thereof, so that no light is leaked to the outside of the lamp reflector 402. In addition, the light returning from the linear light guiding plate 403 toward the light emitting diode 401 is reflected at the lamp reflector 402 to again travel back to the linear light guiding plate 403.

The light entering the linear light guiding plate 403 through the first end surface thereof propagates in the inside of the linear light guiding plate while repeating the total reflections. The light is scattered by ink dots 404 printed on the side surface opposite to the first side surface 433 which faces the plate-like light guiding plate 403, so that the scattered light is allowed to exit from the linear light guiding plate to be incident on a second end surface 434 of a plate-like light guiding plate (second light guiding plate) 406.

The linear light guiding plate preferably has a rectangular cross-section. This is because the rectangular cross-section is likely to induce the total reflection and can be easily fabricated. It should be noted, however, that the linear light guiding plate may have a cross-section of any other shape, e.g., an elliptical cross-section, so long as the total reflection of light is realized. Moreover, a material to be used for the linear light guiding plate may be any material, such as an acrylic resin, so long as the total reflection of light can be realized.

In order to effectively use the light scattered by the ink dots 404 and emitted from the linear light guiding plate toward the direction opposite to the plate-like light guiding plate, a reflecting plate 405 is disposed in the rear side surface of the linear light guiding plate on which the ink dots are formed. It should be noted that the reflecting plate 405 and the linear light guiding plate 403 should not be closely contact to each other. In other words, the linear light guiding plate 403 is required to contact the air.

The light scattered by the ink dots 404 is allowed to emit also through the upper surface of the linear light guiding plate and the lower surface of the linear light guiding plate. Thus, the linear light guiding plate 403 may be surrounded by a reflecting plate 405, a reflecting plate 408, and a reflecting plate 415.

The ink dots 404 provided on the side surface of the linear light guiding plate 403 will be described. If the ink dots are uniformly printed, portions closer to the light emitting diode become bright while portions away from the light emitting diode become dark. Thus, the size and/or the density of the ink dots are varied in order to obtain a uniform line light source. More specifically, in the vicinity of the light emitting diode, the size of ink dots is reduced and/or the density thereof is lowered so that the light is less likely to be scattered. As further away from the light emitting diode, the size of the ink dots are enlarged and the density thereof is increased.

The ink dots 404 formed on the side surface of the linear light guiding plate 403 are only required to have a function of breaking the total reflection condition and scattering the light. Thus, any structural member other than the ink dots, for example, a prism, a roughened surface, or a projection, may be provided.

Moreover, in order to diffuse the point light source to obtain a more uniform line light source, a diffusion sheet or a lenticular lens may be disposed between the linear light guiding plate 403 and the plate-like light guiding plate 406.

The combination of the linear light guiding plate 403 and the light emitting diode 401 may be disposed on up to four side surfaces of the plate-like light guiding plate. Thus, even when the point light source is employed, it can be converted into a line light source by means of a linear light guiding plate to obtain a uniform line light source.

Then, the plate-like light guiding plate 406 will be described below. Since the lighting system employs a back light, the ink dots 407 are printed on a lower surface (a surface opposite to a upper surface which is closer to a viewer) of the plate-like light guiding plate 406 in order to allow the light incident on the plate-like light guiding plate to be scattered toward the viewer. The ink dots are desirably white-colored in order to effectively scatter the light.

Similarly as the ink dots formed on the linear light guiding plate, if the ink dots are uniformly printed on the lower surface of the plate-like light guiding plate 406, in-plane unevenness of brightness is induced. Accordingly, in order to obtain a uniform plane light source, the size and/or the density of the ink dots are varied. More specifically, in the vicinity of the linear light guiding plate, the size of ink dots is reduced and/or the density thereof is lowered so that the light is less likely to be scattered. As further away therefrom, the size of the ink dots are enlarged and/or the density thereof is increased. Thus, the point light source is converted into the plane light source to obtain a uniform back light with less in-plane unevenness of brightness.

Figure 30:
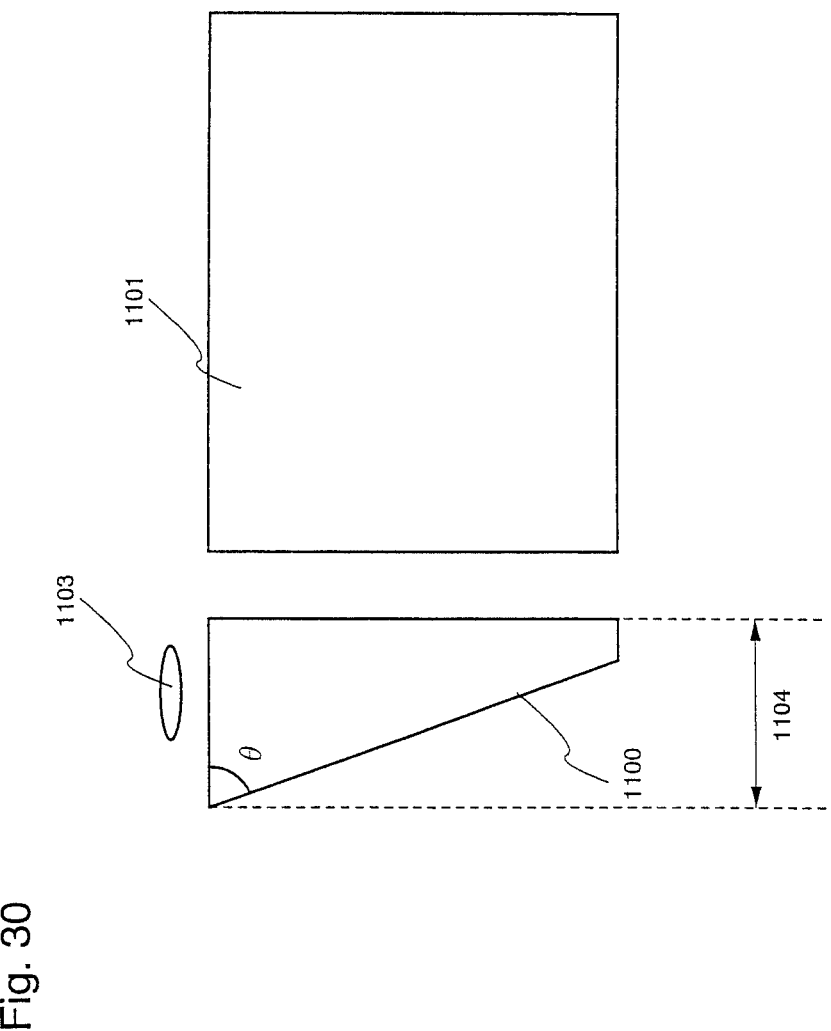
FIG. 30 illustrates a perspective view of the back light in Embodiment Mode 1.
Figure 31:
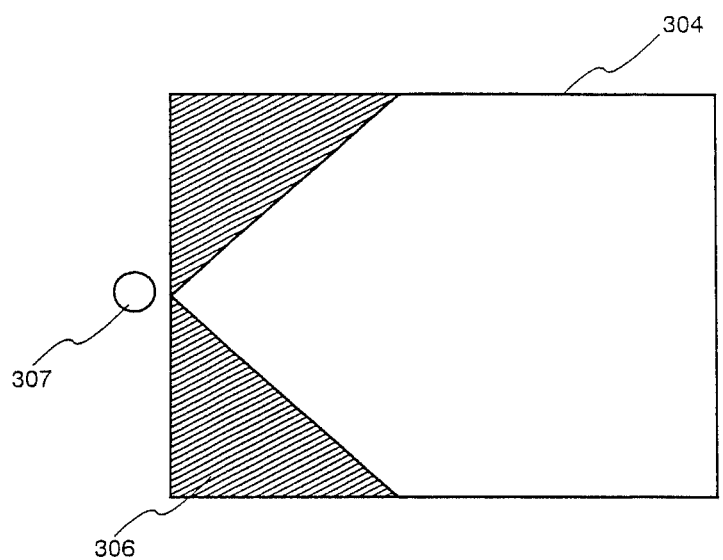
FIG. 31 illustrates a plan view of an illumination apparatus which employs the conventional point light source.

The light guiding plate which converts a point light source into a line light source may have a wedge-like shape in which a lateral width becomes narrower as further away from the point light source. FIG. 30 illustrates an upper surface of an illumination apparatus of the present embodiment mode in which a wedge-shaped light guiding plate is used as means for converting the point light source into the line light source. In FIG. 30, a wedge-shaped light guiding plate 1100, a plate-like light guiding plate 1101 provided adjacent to a side surface of the wedge-shaped light guiding plate via an air layer, and a point light source 1103 are illustrated. In this illumination apparatus, light emitted from the point light source is converted to be linear by means of the wedge-shaped light guiding plate to be incident onto the plate-like light guiding plate. Accordingly, uniform brightness can be obtained in a wider area as compared to the case in which the light emitted from the point light source is directly incident on the plate-like light guiding plate. It should be noted, however, that in the wedge-shaped light guiding plate, a component 1104 orthogonal to the plate-like light guiding plate becomes longer as one side of the plate-like light guiding plate becomes longer. In a liquid crystal display device, peripheral portions of an outline except for a display region is referred to as a peripheral rim, and a recent trend is a narrower peripheral rim in which an area of the peripheral rim is reduced. When the wedge-shaped light guiding plate occupies a large portion with respect to the display region, it becomes difficult to realize the narrow peripheral rim. Thus, as the light guiding plate for converting the point light source into the line light source in the present embodiment mode, it is preferable to employ such a linear light guiding plate having a constant lateral width.

Embodiment Mode 2

The present embodiment mode describes an example in which the present invention is applied to a front light of a reflection type liquid crystal electro-optical device. The embodiment mode is characterized in that a point light source by means of a light emitting diode is converted into a line light source by a linear light guiding plate.

In order to explain Embodiment Mode 2, six surfaces of the light guiding plate are defined as shown in a perspective view of FIG. 19A. More specifically, a surface closer to a viewer is referred to as an upper surface 735. A surface opposite to the upper surface is referred to as a lower surface 736. A surface on which the light emitted from a light source 737 is specifically referred to as an end surface 738. Surfaces perpendicular to the end surface are referred to as side surfaces 739. The other side surface is referred to as a surface 740 parallel to the end surface. The following descriptions with reference to FIGS. 4, 5A and 5B, 6, 7A and 7B are based on the above definitions.

Only points different from Embodiment Mode 1 will be described in detail. Since the present invention is applied to the reflection type liquid crystal electro-optical device in the present embodiment mode, the plate-like light guiding plate is different from that employed in Embodiment Mode 1. The point light source is converted into the line light source by means of the light emitting diode and the linear light guiding plate, as in Embodiment Mode 1.

Figure 4:
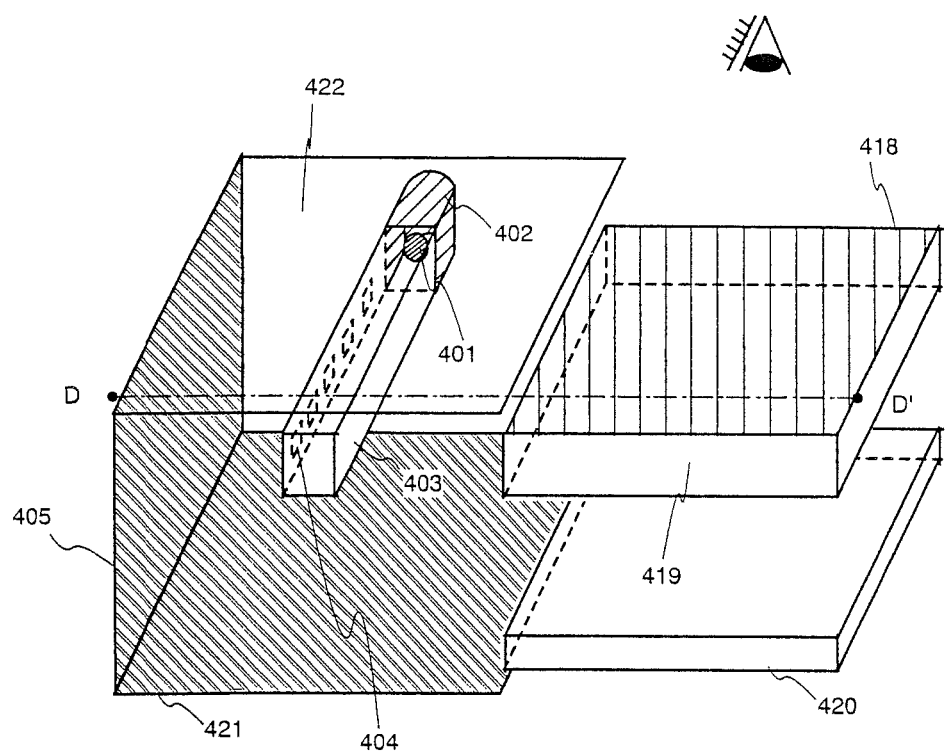
FIG. 4 illustrates a perspective view of a prism-type front light in Embodiment Mode 2.

The structure of the present embodiment mode will be described with reference to FIGS. 4, 5A and 5B, 6, 7A and 7B. A perspective view in FIG. 4 illustrates a front light in the present embodiment mode. The light emitted from the light emitting diode 401 is reflected at the lamp reflector 402 to be incident on the end surface of the linear light guiding plate 403 and then scattered by the ink dots 404 formed on the side surface of the linear light guiding plate toward a plate-like light guiding plate 419. The light scattered by the ink dots 404 can be also emitted through the upper surface of the linear light guiding plate 403 and the lower surface of the linear light guiding plate. Thus, the linear light guiding plate is surrounded by reflecting plates 421 and 422 and a reflecting plate 405 so that the light scattered by the ink dots and leaked to the outside of the linear light guiding plate is reflected to travel back to the linear light guiding plate so as to improve the light usage efficiency.

Figure 5A:
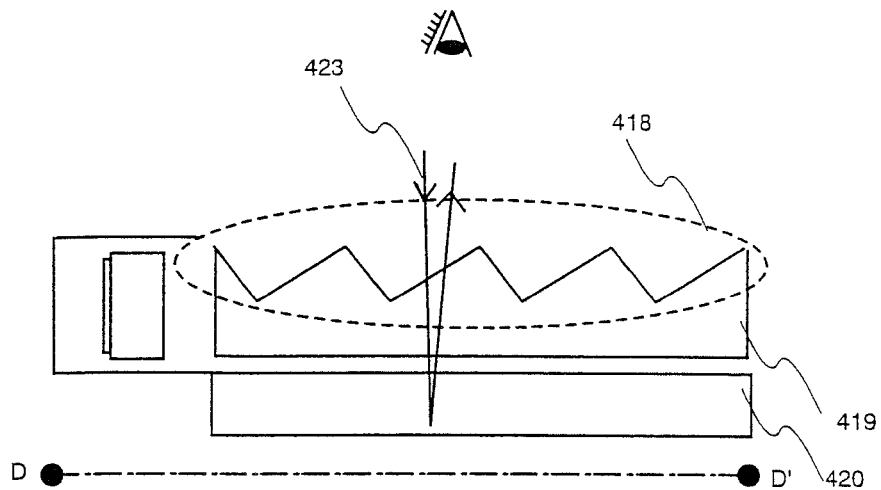
FIGS. 5A and 5B each illustrate a cross-sectional view for explaining the light propagation of the prism-type front light in Embodiment Mode 2.
Figure 5B:
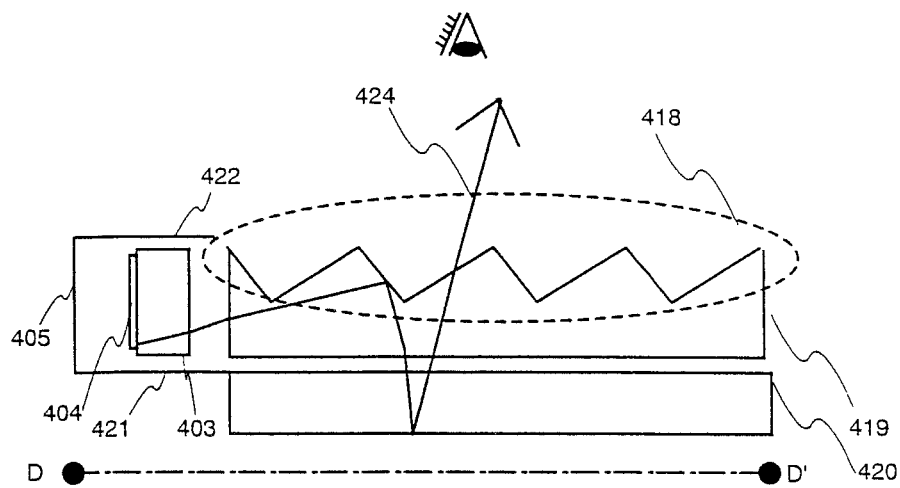

The light emitted from the side surface of the linear light guiding plate to be incident on the end surface of the plate-like light guiding plate 419 is totally reflected by the side surface of the plate-like light guiding plate orthogonal to the end surface of the plate-like light guiding plate so as to be expanded throughout the inside of the plate-like light guiding plate. It should be noted that the upper surface of the plate-like light guiding plate 419 is subjected to a special processing 418 so that the reflected light surface-reflected at the upper surface of the plate-like light guiding plate 419 is incident on a reflection type liquid crystal electro-optical device 420. Examples of the special processing are explained with reference to cross-sectional views in FIGS. 5A and 5B. FIGS. 5A and 5B illustrate examples of a prism-type front light in which the upper surface of the plate-like light guiding plate 419 is subjected to the special processing into a prism-shape. FIGS. 5A and 5B illustrate views obtained by cutting FIG. 4 along a chain line D-D'. FIG. 5A illustrates an operation when the light is off. External light 423 is incident on the plate-like light guiding plate 419. The external light 423 is reflected at a reflection type liquid crystal electro-optical device 420 so that the light containing image information is recognized by a viewer. FIG. 5B illustrates an operation when the light is on. The light 424 emitted from the light emitting diode propagates in the linear light guiding plate 403 to be scattered by the ink dots 404. The light scattered by the ink dots is incident on the plate-like light guiding plate 419. In this case, the light incident on the plate-like light guiding plate is converted into the line light source by means of the linear light guiding plate. The light is then surface-reflected by the special processing 418, i.e., a prism-shape, of the upper surface of the plate-like light guiding plate to be incident on a reflection type liquid crystal electro-optical device 420. Thus, the light containing the image information is recognized by a viewer.

Figure 6:
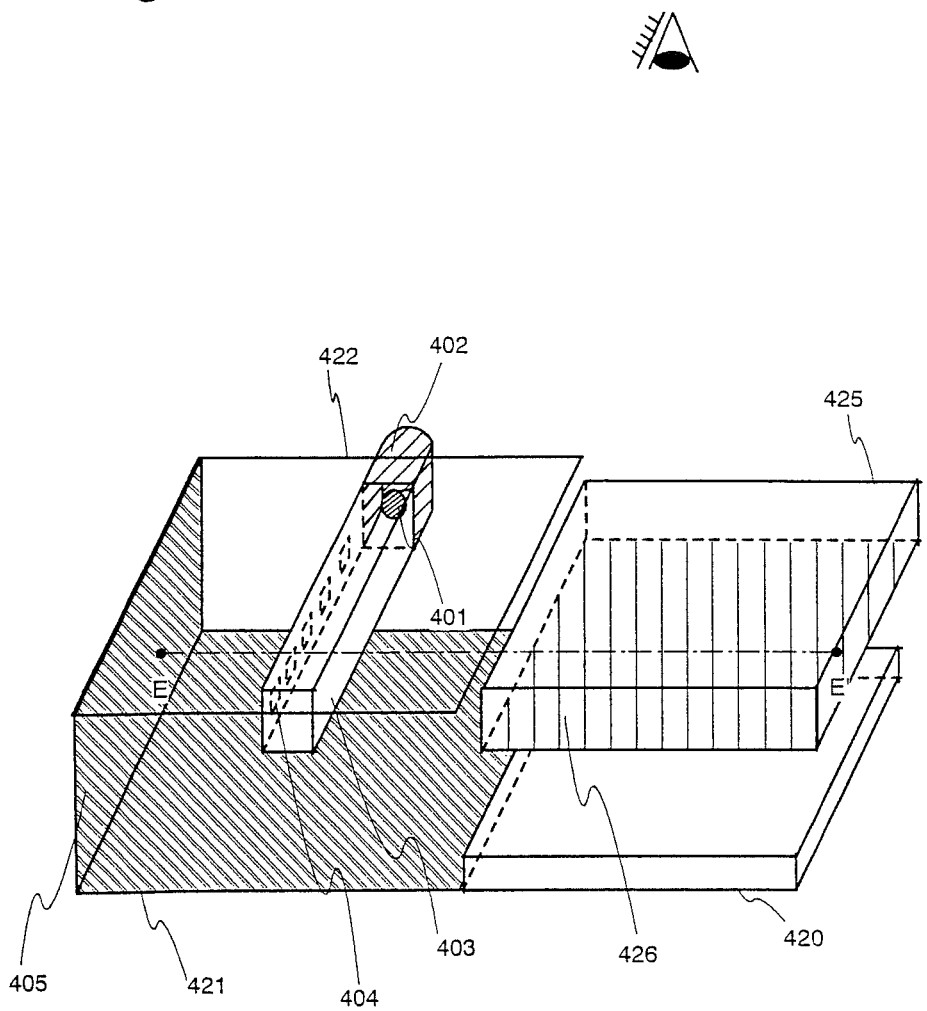
FIG. 6 illustrates a perspective view of a projection-shape front light in Embodiment Mode 2.
Figure 7A:
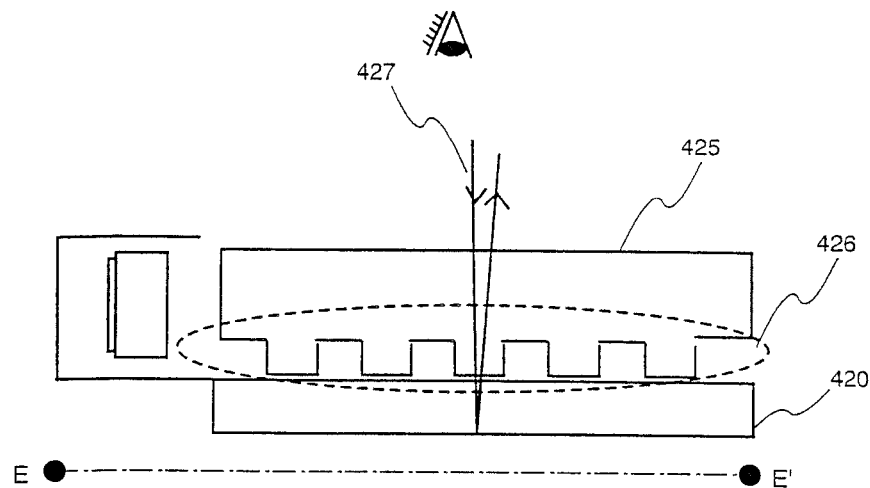
FIGS. 7A and 7B each illustrate a cross-sectional view for explaining the light propagation of the projection-shape front light in Embodiment Mode 2.
Figure 7B:
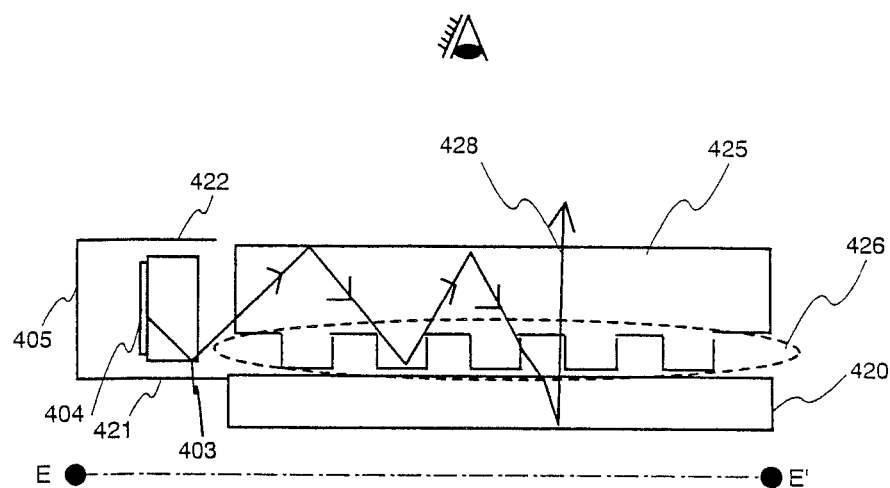
Figure 8:
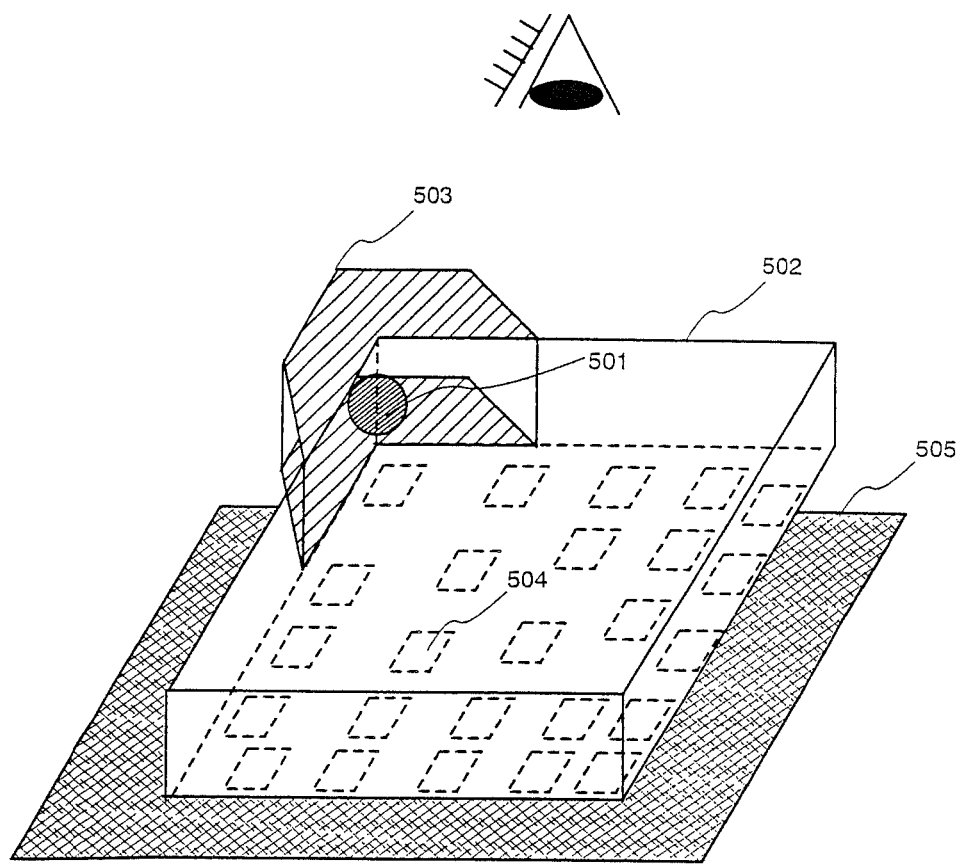
FIG. 8 illustrates a perspective view of a back light in accordance with the present invention.
Figure 9A:
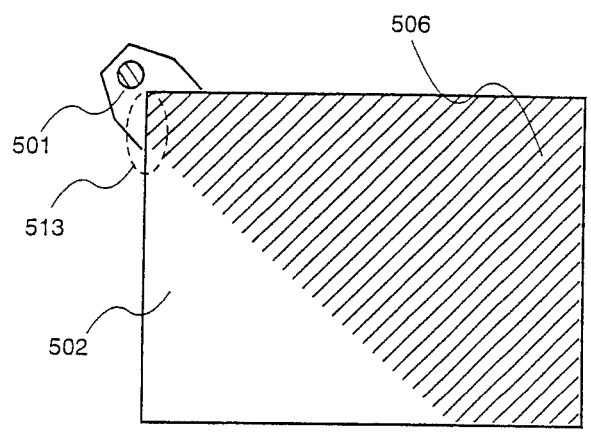
FIGS. 9A, 9B, and 9C each illustrate a cross-sectional view for explaining the light propagation of the back light in accordance with the present invention.
Figure 9B:
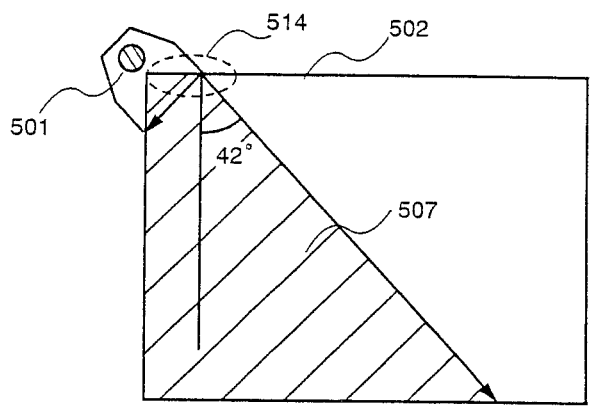
Figure 9C:
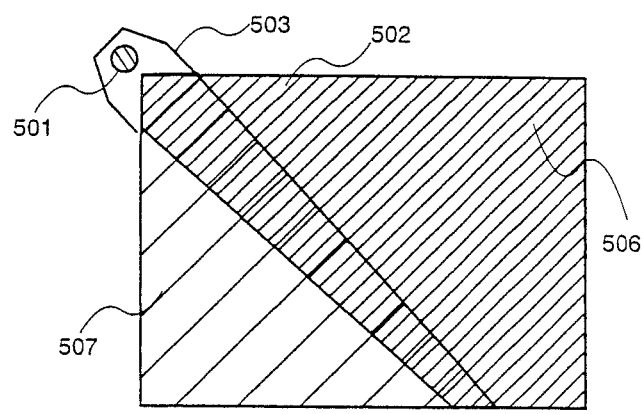

Examples in which the special processing is provided on the lower surface of the plate-like light guiding plate will be described with reference to FIG. 6 and FIGS. 7A and 7B. A perspective view of FIG. 6 illustrates a projection-shape front light in which the lower surface of the plate-like light guiding plate 425 is specially processed into a projection-shape 426. The functions of the light emitting diode 401, the lamp reflector 402, the linear light guiding plate 403, the ink dots 404, the reflecting plates 421 and 422, and the reflecting plate 405 illustrated in FIG. 6 are the same as those explained with reference to FIG. 4. A reflection type liquid crystal electro-optical device 420 is disposed below the plate-like light guiding plate. The light incident on the end surface of the plate-like light guiding plate 425 is totally reflected at the two side surfaces orthogonal to the end surface of the plate-like light guiding plate so as to be expanded entirely over the plate-like light guiding plate. The lower surface of the plate-like light guiding plate 425 is subjected to the special processing to be provided with the projections 426. The propagation of light incident onto the projections formed on the lower surface of the plate-like light guiding plate is illustrated in FIGS. 7A and 7B. The cross-sectional views in FIGS. 7A and 7B are obtained by cutting the perspective view of FIG. 6 along a chain line E-E'. FIGS. 7A and 7B illustrate the light propagation viewed from the side surfaces of the plate-like light guiding plate, the linear light guiding plate and the reflection type liquid crystal electro-optical device. FIG. 7A illustrates an operation when the light is off. External light 427 is incident on the plate-like light guiding plate 425 having the lower surface provided with the projections 426. The external light 427 is reflected at a reflection type liquid crystal electro-optical device 420 so that the light containing image information is recognized by a viewer. FIG. 7B illustrates an operation when the light is on. The light 428 emitted from the light emitting diode propagates in the linear light guiding plate 403 to be scattered by the ink dots 404 formed on the side surface of the linear light guiding plate. The light scattered by the ink dots 404 is incident on the plate-like light guiding plate 425. The total reflection condition is broken by the projections 426 so that the light is refracted at the interface between the projections and the air to be incident on the reflection type liquid crystal electro-optical device. Thus, the light containing the image information is recognized by a viewer in the display region of the reflection type liquid crystal electro-optical device.

Thus, in Embodiment Mode 2, the case where the present invention is applied to a front light of the reflection type liquid crystal electro-optical device has been described.

Embodiment Mode 3

The present invention will be described in Embodiment Mode 3. The present embodiment mode is characterized by the shape of the plate-like light guiding plate. More specifically, in the present embodiment mode, the first side surface of the plate-like light guiding plate on which the light is to be incident is configured to have an angle of 45° with respect to the other side surfaces of the plate-like light guiding plate. The point light source such as a light emitting diode is disposed in front of the first side surface.

Figure 10:
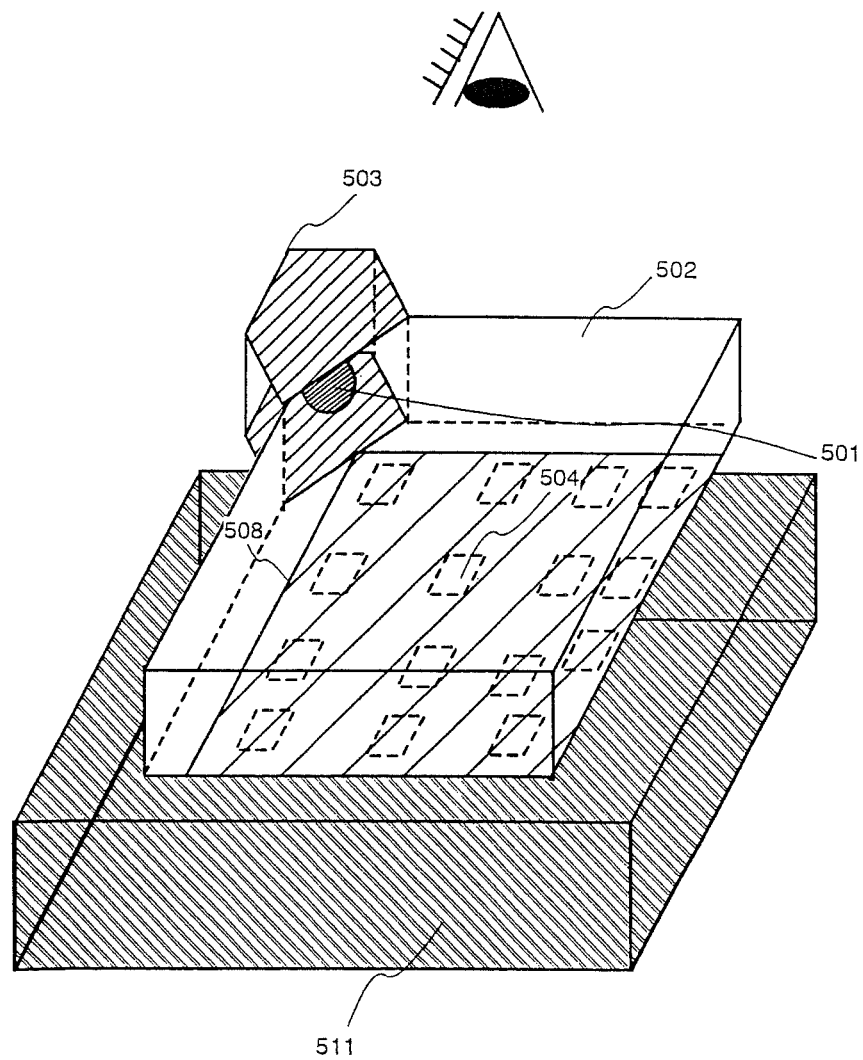
FIG. 10 illustrates a perspective view of a back light in Embodiment Mode 3.
Figure 19B:
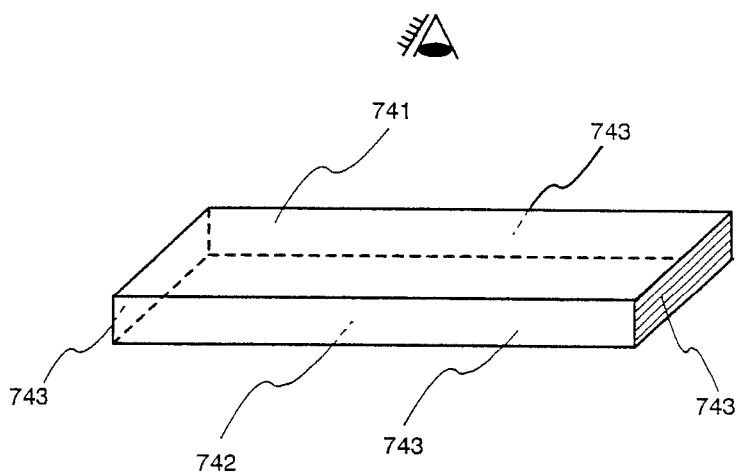
Figure 20A:
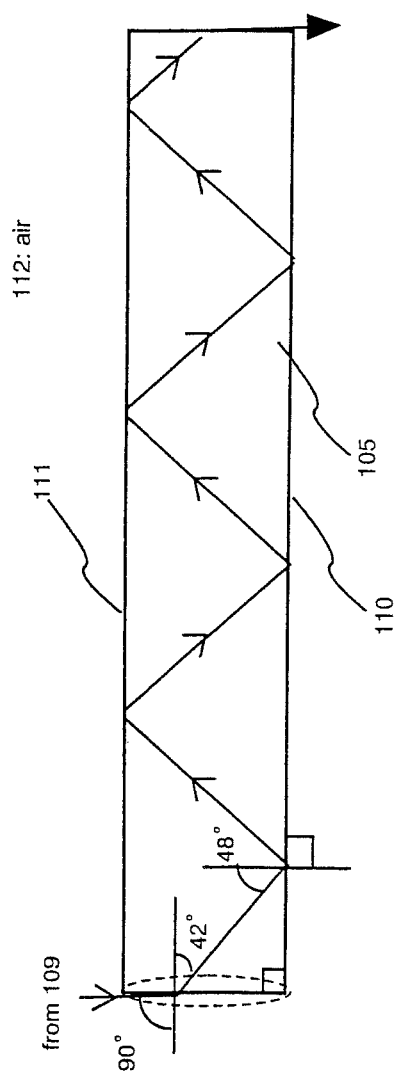
FIGS. 20A and 20B each illustrate a cross-sectional view for explaining the light propagation of the plate-like light guiding plate.
Figure 20B:
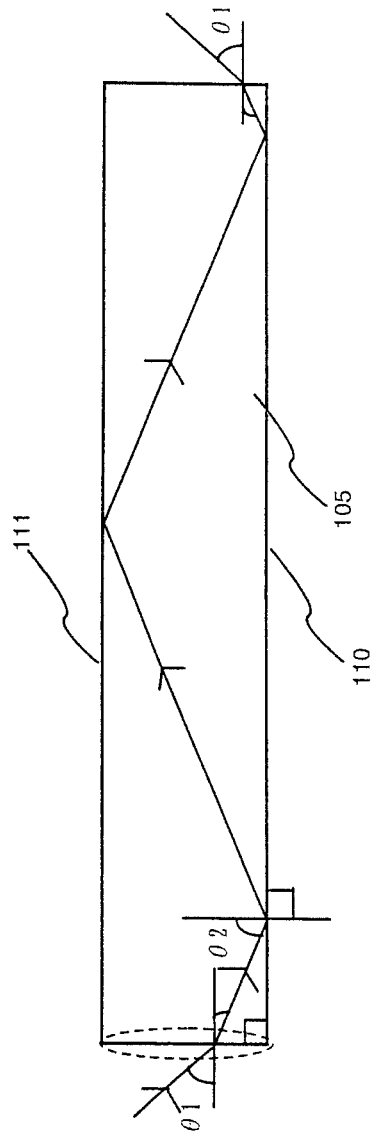
Figure 21:
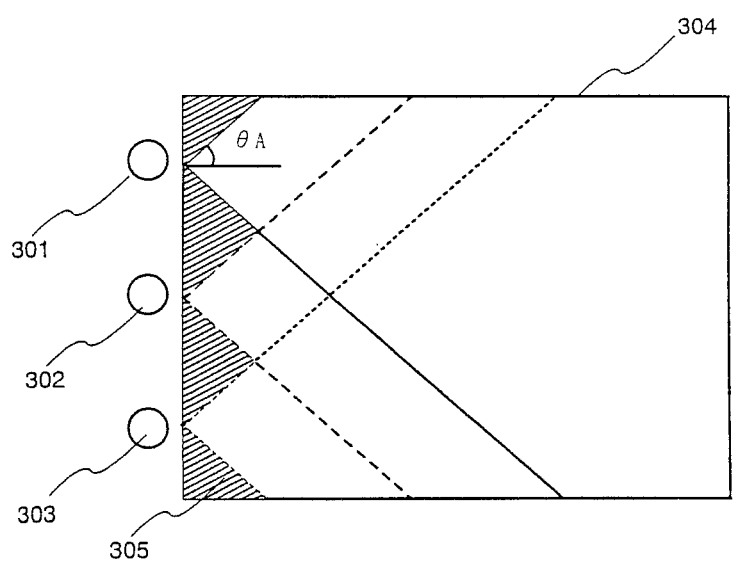
FIG. 21 illustrates a plan view of an illumination apparatus which employs the conventional point light source.
Figure 22:
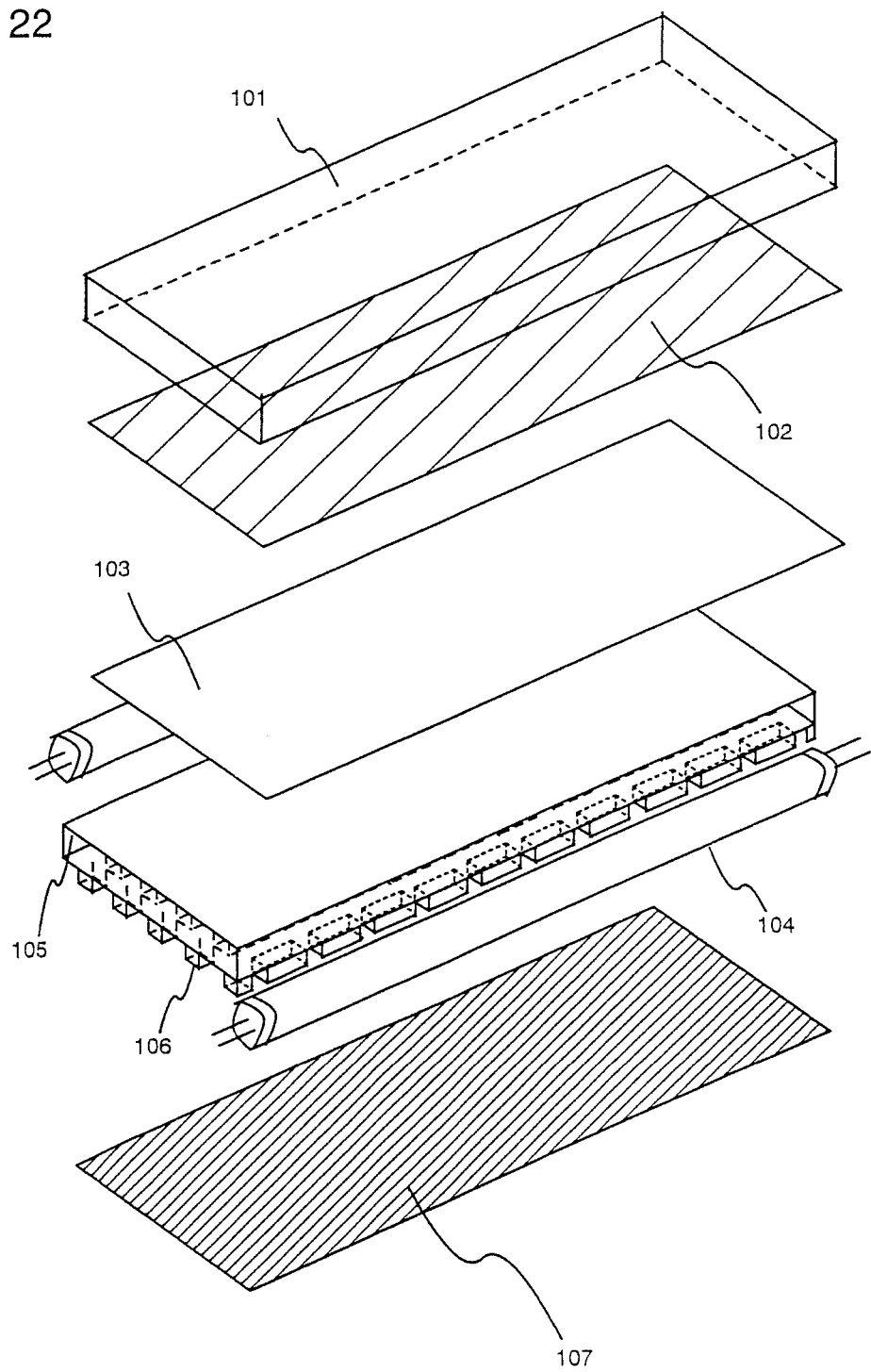
FIG. 22 illustrates a perspective view of the edge-type back light.
Figure 23:
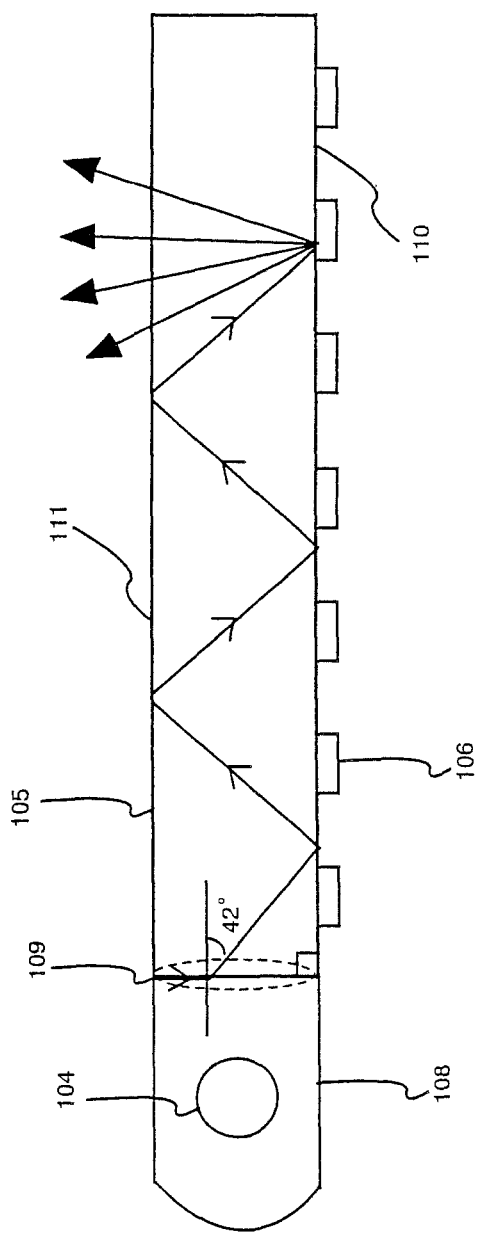
FIG. 23 illustrates a cross-sectional view of the edge-type back light.
Figure 24A:
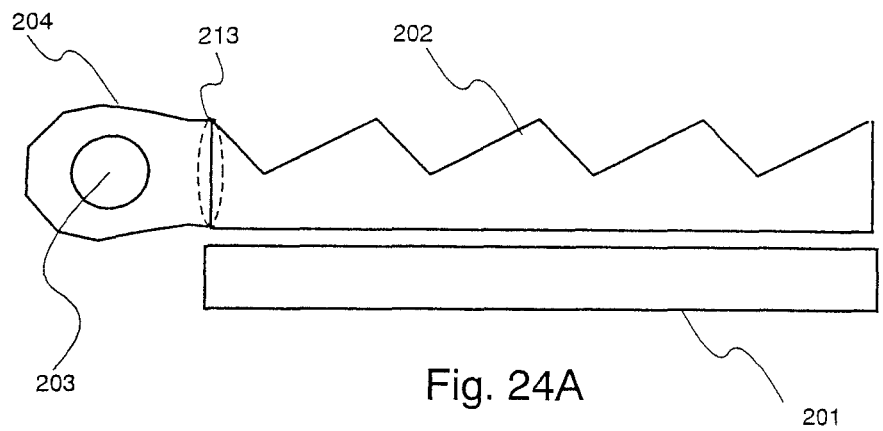
FIGS. 24A, 24B, and 24C each illustrate a cross-sectional view of the prism-type front light.
Figure 24B:
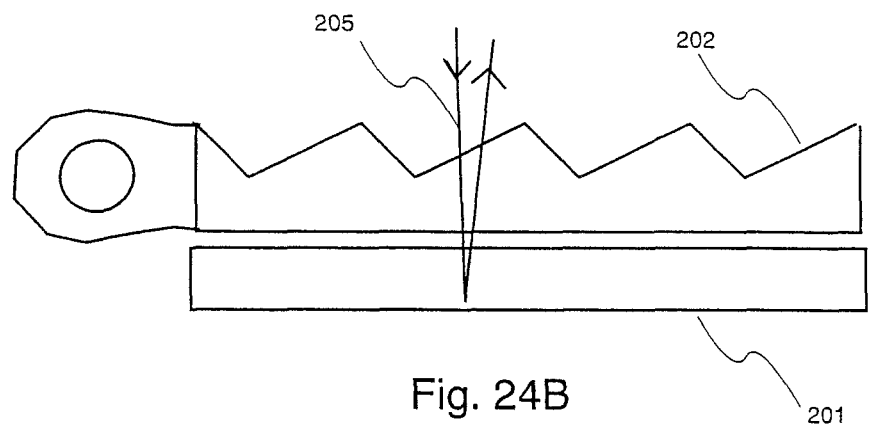
Figure 24C:
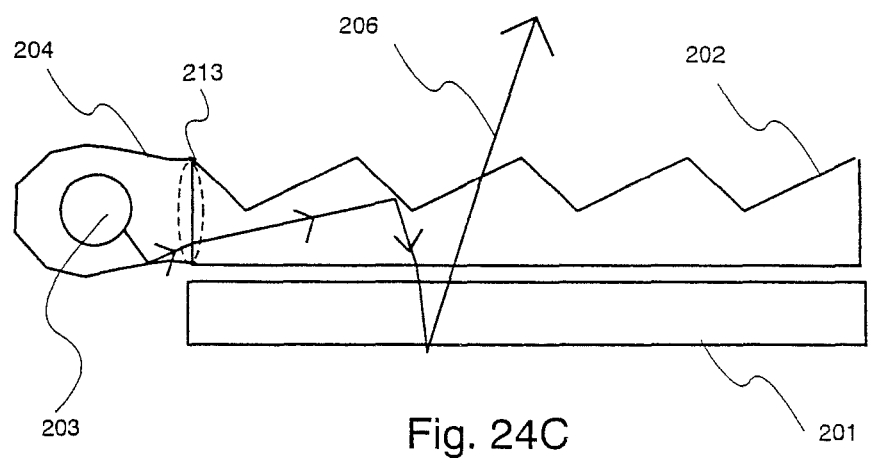
Figure 25A:
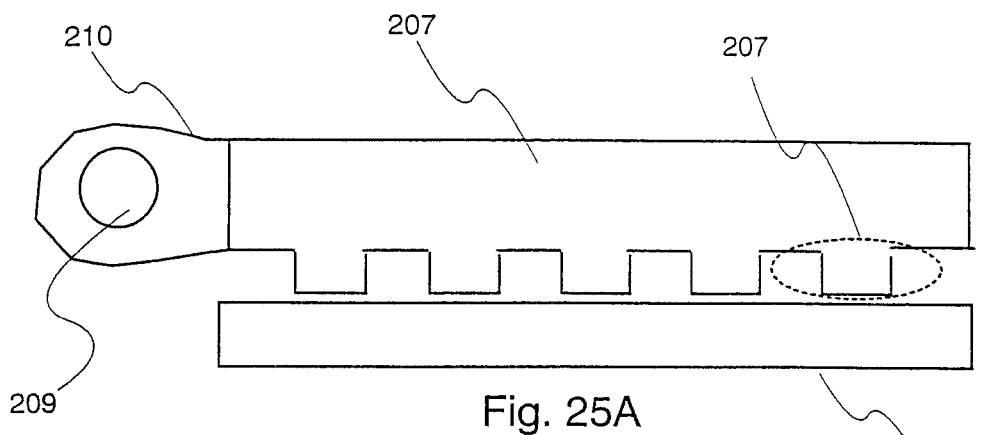
FIGS. 25A, 25B, and 25C each illustrate a cross-sectional view of the projection-shape front light.
Figure 25B:
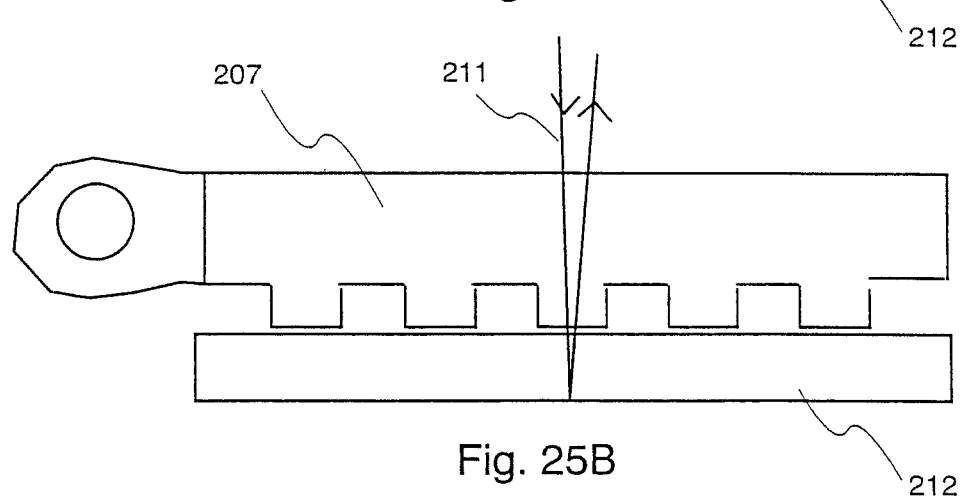
Figure 25C:
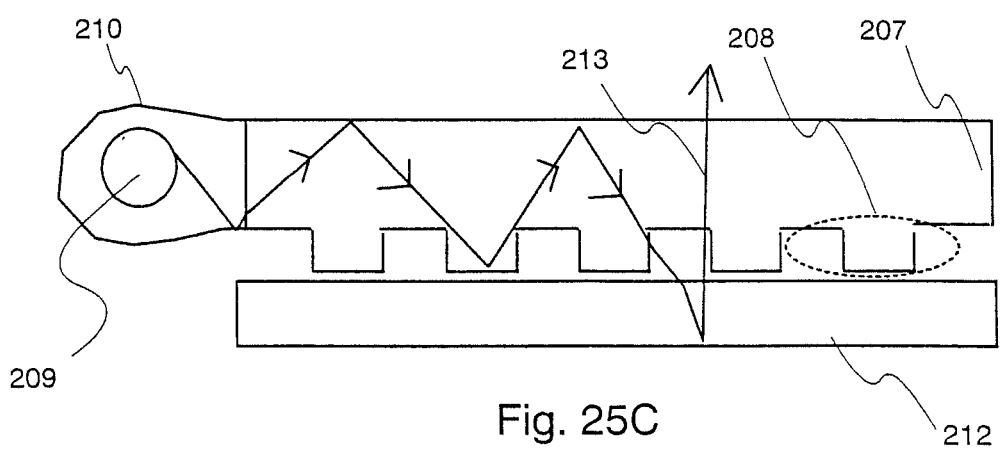
Figure 26:
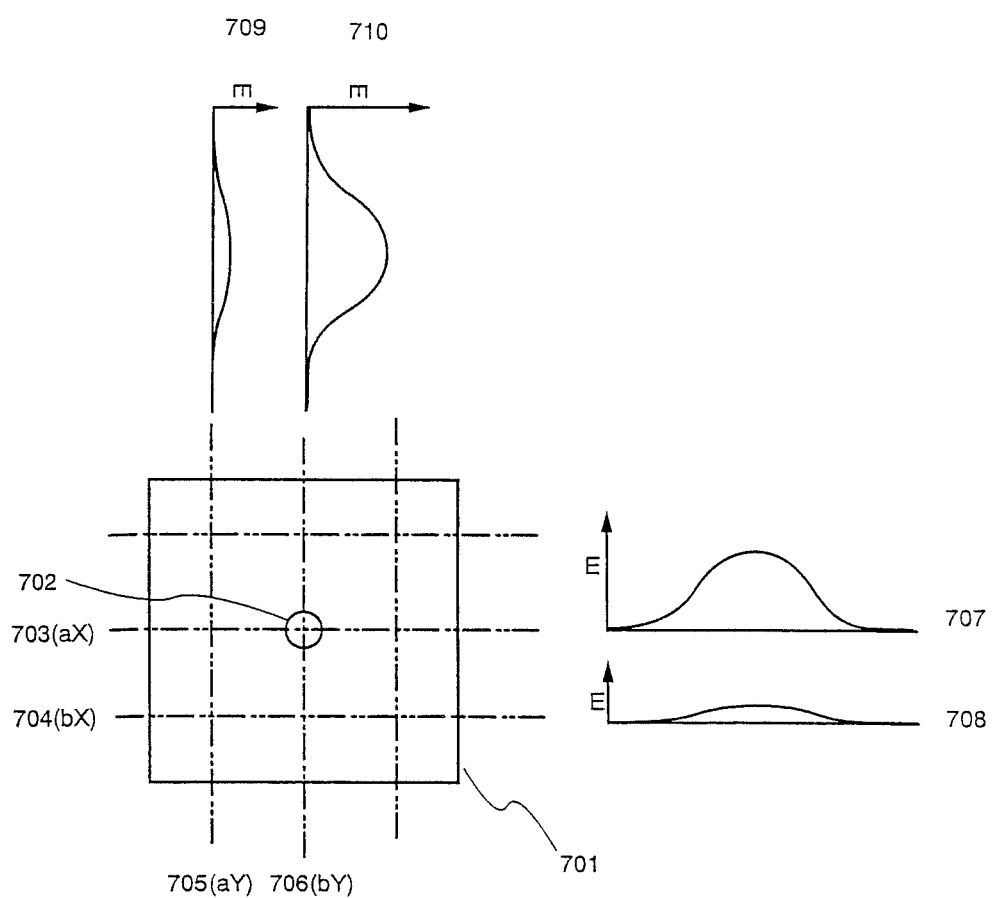
FIG. 26 illustrates a plan view for explaining the definition of the point light source.
Figure 27:
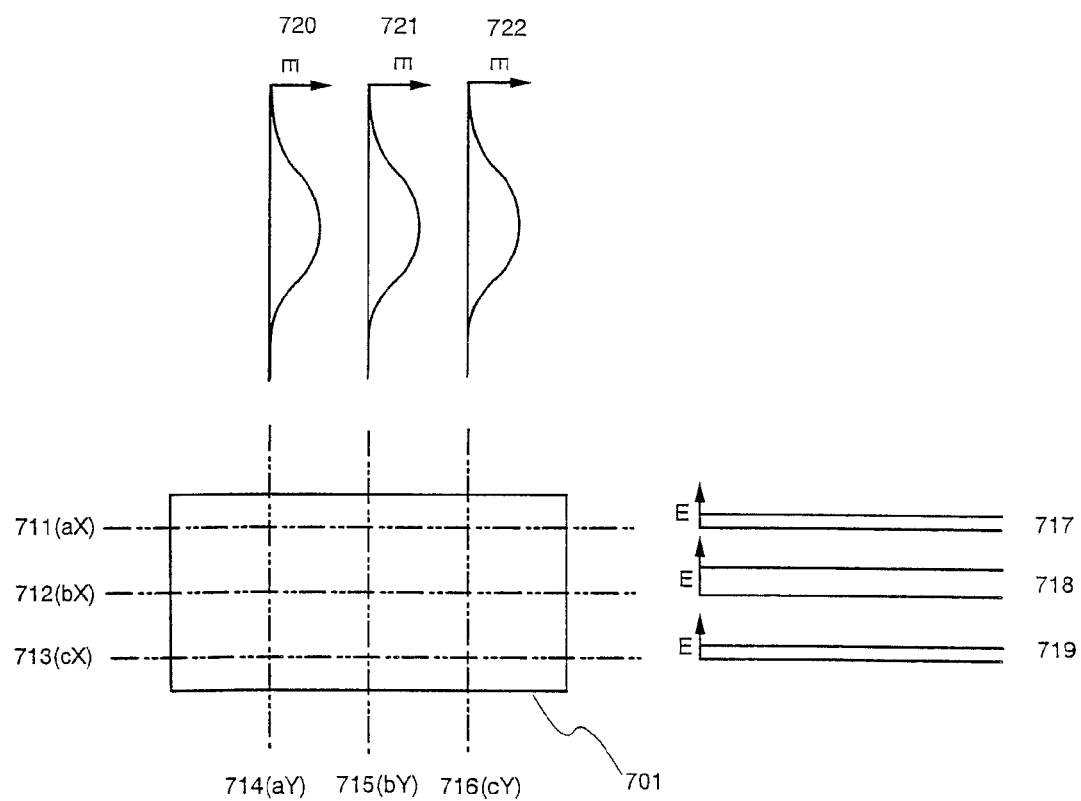
FIG. 27 illustrates a plan view for explaining the definition of the line light source.
Figure 28:
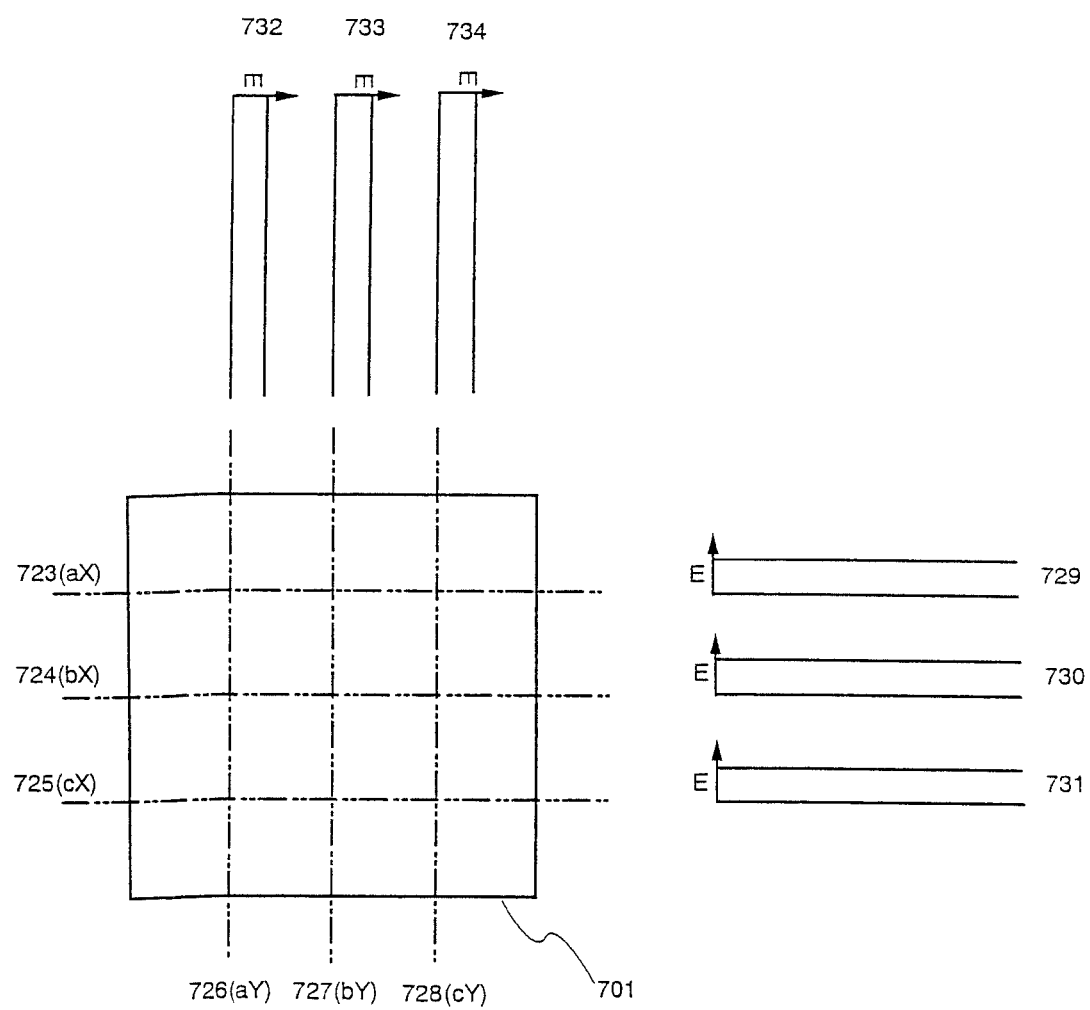
FIG. 28 illustrates a plan view for explaining the definition of the plane light source.

In order to explain Embodiment Mode 3, surfaces of the plate-like light guiding plate are defined as shown in a perspective view of FIG. 19B. More specifically, a surface closer to a viewer is referred to as an upper surface 741. A surface opposite to the upper surface is referred to as a lower surface 742. The remaining surfaces are referred to as side surfaces 743. The following descriptions with reference to FIGS. 10, 11A, and 11B are based on the above definitions.

Figure 11A:
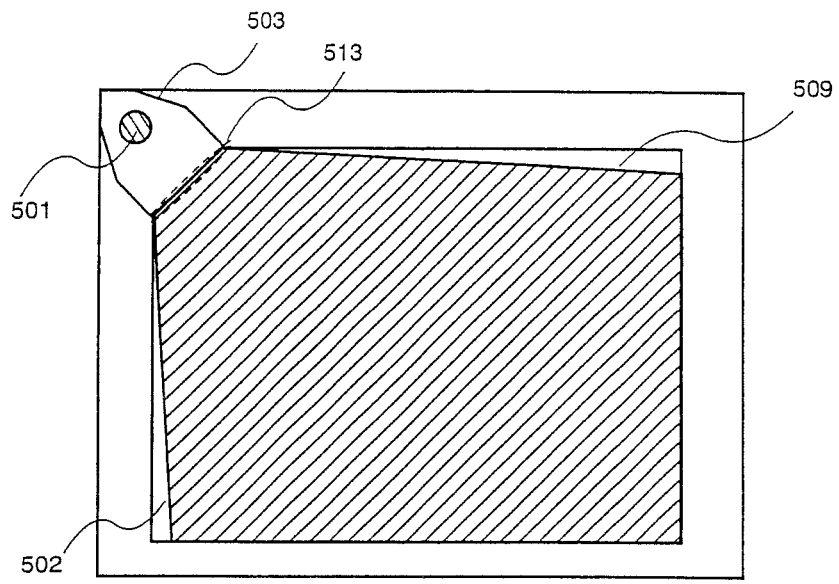
FIGS. 11A and 11B each illustrate a cross-sectional view for explaining the light propagation of the back light in Embodiment Mode 3.
Figure 11B:
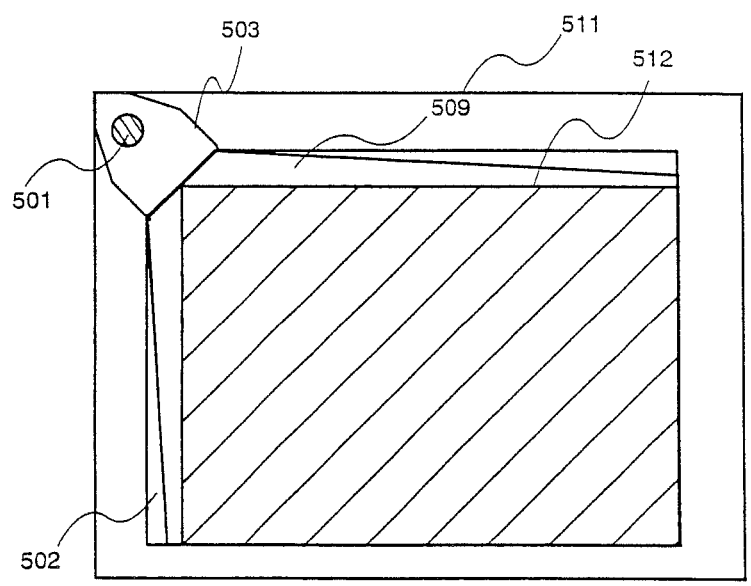

FIGS. 11A and 11B illustrate cross-sectional views of an illumination apparatus of the present embodiment mode when viewed from a viewer. The light propagation will be described with reference to FIGS. 11A and 11B. FIG. 11A illustrates a region 509 over which the light is expanded in the plate-like light guiding plate in the structure in accordance with the present embodiment mode. More specifically, the light is emitted first from the light emitting diode 501 disposed in front of a first side surface 513 of the plate-like light guiding plate 502 and then reflected at a lamp reflector 503, so that the light emitted from the light emitting diode 501 is incident on a first side surface of the plate-like light guiding plate 502. In this case, the medium through which the light is to propagate is changed from the air having the refractive index of 1 to the plate-like light guiding plate having the refractive index of 1.49. Accordingly, the light incident from the air onto the first side surface of the plate-like light guiding plate at any angle is expanded over the region inclined against the normal direction of the first side surface at an angle of 42°. The region surely irradiated with the light in the plate-like light guiding plate is denoted by reference numeral 509.

FIG. 11B illustrates a cross-sectional view indicating the relationship between the region 509 over which the light is expanded and a display region 512. The region 509 surely irradiated with the light includes the rectangular display region 512. Thus, as shown in FIG. 11B, the light is expanded over the entire display region 512. In addition, in the structure of the present embodiment mode, the area of the light expanded to the outside of the display region is minute, so that the light usage efficiency is excellent. Moreover, since the light incident on the side surface of the plate-like light guiding plate at an angle smaller than the critical angle is leaked to the outside of the plate-like light guiding plate, the light which does not meet the total reflection condition is required to be returned to the plate-like light guiding plate by a reflecting plate 511 provided around the plate-like light guiding plate. In FIG. 11B, the reflecting plate 511 is disposed apart from the plate-like light guiding plate. Alternatively, a reflecting tape onto which aluminum is vapor-deposited may be adhered in close contact to the plate-like light guiding plate.

In accordance with the present embodiment mode, the advantage of increasing the display region as compared to the case where the point light source is to be disposed at the center of the side surface of the plate-like light guiding plate can be achieved, and therefore, the area of the peripheral rim which is not included in the display region can be decreased so that the narrow peripheral rim of the display device can be realized. In addition, since the plate-like light guiding plate to be used in the present embodiment mode has a structure which can be easily processed, the high producibility can be realized even in mass-production.

FIG. 10 illustrates a perspective view of the back light in accordance with the present embodiment mode. As shown in FIG. 10, the ink dots 504 are printed on a lower surface of the plate-like light guiding plate 502. When the light propagating in the plate-like light guiding plate 502 while repeating the total reflections therein is incident on the ink dots, the light is scattered by the ink dots to be emitted toward the viewer. The ink dots are preferably formed at a higher density at portions further away from the light source. A region 508 in the plate-like light guiding plate over which the light is to be expanded corresponds to almost the entire region of the plate-like light guiding plate. In addition, the point light source 501 is disposed in front of a first surface of the plate-like light guiding plate, and the lamp reflector 503 is provided around the point light source to contact the peripheral portion of the first side surface.

Although the point light source has been described as the light emitting diode in the present invention, application of the present invention is not limited to such a case. For example, a midget lamp can be used as the point light source. In the structure as shown in FIG. 10, the illumination apparatus in accordance with the present invention is used as a back light of the transmission type liquid crystal electro-optical device. By replacing the ink dots formed on the lower surface of the plate-like light guiding plate in FIG. 10 with projections having a rectangular cross-section, the illumination apparatus in accordance with the present invention can be used as a front light of a reflection type liquid crystal electro-optical device.

Embodiment Mode 4

Figure 29:
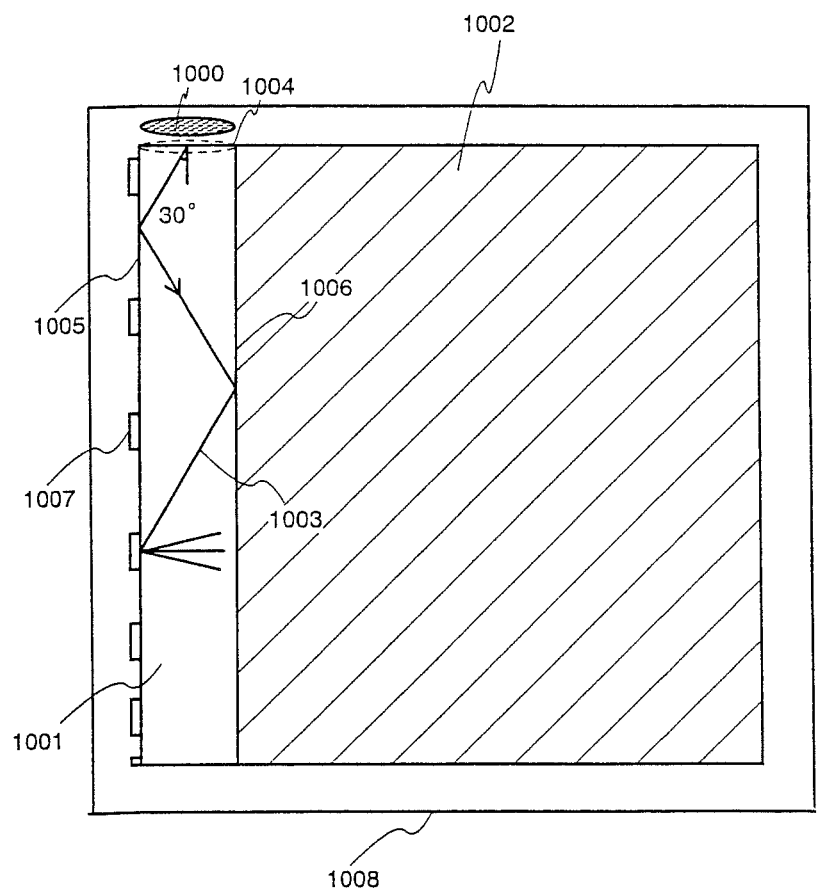
FIG. 29 illustrates a cross-sectional view for explaining the light propagation of the back light in Embodiment Mode 4.

In the present embodiment mode, in the illumination apparatus which converts a point light source into a line light source and the line light source into a plane light source, further miniaturization of the illumination apparatus will be achieved as compared to Embodiment Mode 1. The present embodiment mode will be described with reference to FIG. 29. FIG. 29 illustrates a cross-sectional view for explaining the light propagation of a back light in accordance with the present embodiment mode.

In order to explain Embodiment Mode 4, six surfaces of the light guiding plate are defined as shown in a perspective view of FIG. 19A. More specifically, a surface closer to a viewer is referred to as an upper surface 735. A surface opposite to the upper surface is referred to as a lower surface 736. A side surface on which the light emitted from a light source 737 is incident is specifically referred to as an end surface 738. Surfaces perpendicular to the end surface are referred to as side surfaces 739. The other side surface is referred to as a surface 740 parallel to the end surface. The following descriptions with reference to FIG. 29 are based on the above definitions.

A point light source 1000 is disposed in front of a first end surface 1004 of a first light guiding plate (linear light guiding plate) 1001, and a first side surface of the first light guiding plate orthogonal to the first end surface contacts a second end surface of a second light guiding plate (plate-like light guiding plate) 1002. Although as the second light guiding plate, a material having the refractive index of 1.4 to 1.6 can be used, an acrylic resin having the refractive index of 1.49 is used in the present embodiment mode. The first light guiding plate preferably has a refractive index of 1.8 or higher in order to allow the light to be totally reflected in the first light guiding plate. However, if the refractive index of the first light guiding plate is too high, the amount of light which exits from the first light guiding plate due to the total reflection to enter the inside of the second light guiding plate is reduced, and accordingly, the refractive index of the first light guiding plate is preferably set to be 3.0 or lower. In the present embodiment mode, the refractive index of the first light guiding plate is set at 2.0. Ink dots 1007 are provided on a side surface opposite to a first side surface which functions as a light emitting surface of the first light guiding plate. The light incident on the ink dots is scattered to exit the first light guiding plate, and the light then passes through a second end surface of the second light guiding plate to enter the inside of the second light guiding plate. The ink dots or the like are formed on the lower surface of the second light guiding plate by a known technique, so that the light is allowed to exit through the upper surface of the second light guiding plate as the light emitted from a plane light source.

The light 1003 emitted from the point light source is incident on a first end surface 1004 of the first light guiding plate at an arbitrary angle, and is expanded in accordance with the Snell's law up to an angle of 30° at the maximum with respect to the normal direction of the first end surface. The light further propagates to an interface 1005 between the first light guiding plate and the air, and since the light is incident on the interface between the first light guiding plate and the air at an angle exceeding the critical angle, the light is totally reflected at the interface between the first light guiding plate and the air. The light further propagates to an interface 1006 between the first light guiding plate and the second light guiding plate, and since the light is incident on the interface between the first light guiding plate and the second light guiding plate at an angle exceeding the critical angle, the light is totally reflected at the interface between the first light guiding plate and the second light guiding plate. In order to allow the light propagating in the first light guiding plate while repeating the total reflections to exit from the first light guiding plate to be incident on the second light guiding plate, the ink dots 1007 are provided on a surface facing a surface at which the first light guiding plate and the second light guiding plate contact to each other. The ink dots are preferably formed so that the density thereof becomes lower at portions further away from the point light source. A reflecting plate 1008 is preferably formed to surround the side surfaces and the lower surfaces of the first light guiding plate and the second light guiding plate in order to allow the light leaked to the outside of the first light guiding plate and the second light guiding plate to be returned toward the linear light guiding plate or the second light guiding plate.

In Embodiment Mode 1, the first light guiding plate and the second light guiding plate are required to be disposed via the air layer interposed therebetween in order to allow the light to be totally reflected in the first light guiding plate. In contrast, in accordance with the present embodiment mode, the light can repeat the total reflections to propagate in the first light guiding plate even when the first light guiding plate contacts the second light guiding plate, since the refractive index of the first light guiding plate is set to be higher than that of the second light guiding plate. Thus, the illumination apparatus can be miniaturized, as compared to that in Embodiment Mode 1 in which the air layer is provided between the first light guiding plate and the second light guiding plate.

In accordance with the illumination apparatus of the present embodiment mode, the light from the point light source 1000 is incident on the first light guiding plate, and the linearly converted light is emitted from the first light guiding plate into the second light guiding plate, and the light converted into a plane light source is allowed to exit through the upper surface of the second light guiding plate.

Embodiment 1

A manufacturing method of a transmission type liquid crystal electro-optical device to be combined with the present invention will be described with reference to FIGS. 12A to 12C, 13A to 13C, 14A, 14B, 15, and 16. Like portions are designated with like reference numerals in FIGS. 12A to 12C, 13A to 13C, 14A, 14B, 15, and 16. A chain line F-F' in FIG. 14B corresponds to a cross-sectional view obtainable by cutting FIG. 16 along the chain line F-F'.

An active-matrix substrate includes gate wiring arranged in the row direction, source wiring arranged in the column direction, a pixel portion having pixel TFTs respectively provided in the vicinity of crossing points of the gate wiring and the source wiring, and a driver circuit including an n-channel TFT and a p-channel TFT. The term "gate wiring" refers herein to a structure in which the gate wiring arranged in the row direction is electrically connected to a gate electrode via a contact hole.

Figure 16:
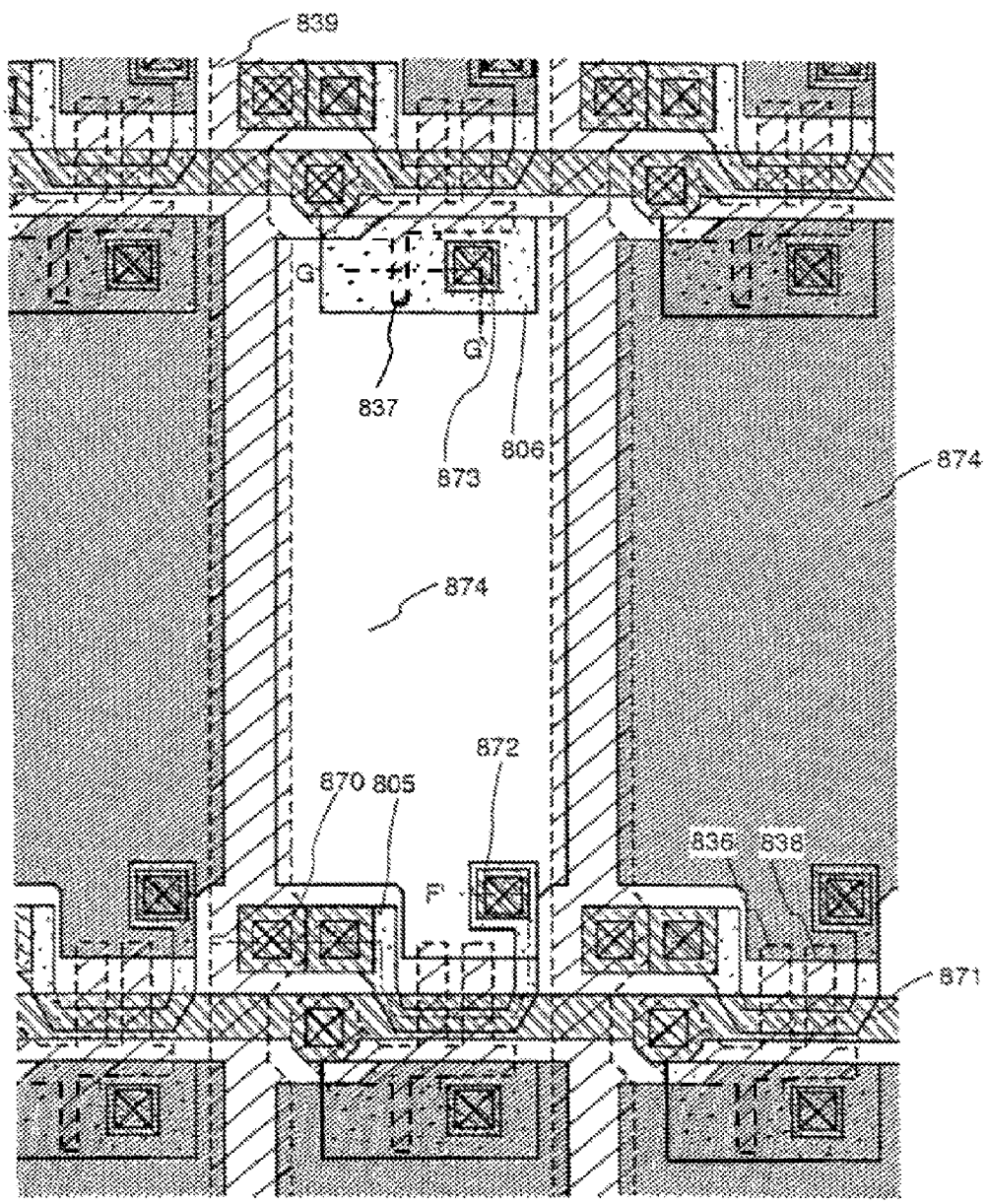
FIG. 16 illustrates a plan view of a TFT in a pixel section in Embodiment 1.

In a plane view of FIG. 16, a source wiring 839, a gate electrode 836, and a gate electrode 838 are formed in the identical layer. An electrode 837 extending from the gate electrode 836 and the gate electrode 838 also functions as a capacitor electrode. A first interlayer insulating film (designated with reference numeral 864 in FIG. 14B) is formed to contact the source wiring 839, the gate electrode 836, and the gate electrode 838. A second interlayer insulating film (designated with reference numeral 865 in FIG. 14B) is formed over the first interlayer insulating film. Furthermore, a gate wiring 871, a capacitor connecting electrode 873, a drain electrode 872, and a source connecting electrode 870 are formed on the second interlayer insulating film.

Since this is a transmission type liquid crystal electro-optical device, a pixel electrode 874 is formed so as to overlap the drain electrode 872. The pixel electrode 874 is made of a transparent conductive film. The pixel electrode 874 is formed so as to overlap the capacitor connecting electrode 873 and the drain electrode 872.

The gate wiring 871 is formed for the gate electrode 836 and the gate electrode 838 via the first interlayer insulating film and the second interlayer insulating film. In the pixel structure shown in FIG. 16, the gate electrode 836 and the gate electrode 838 are formed in an island-shaped pattern, and function not only as the gate electrode but also as one of electrodes constituting a storage capacitor of the adjacent pixel, as described previously.

In other words, the storage capacitor of the pixel electrode 874 employs the insulating film covering the island-shape semiconductor films 805 and 806 as its dielectric. The pixel electrode 874 is electrically connected to the capacitor connecting electrode 873, and the capacitor connecting electrode 873 is electrically connected to the island-shaped semiconductor film 806. Thus, the island shaped semiconductor film 806 functions as a first capacitor electrode. The electrode 837 functions as a second capacitor electrode.

Regions between the adjacent pixels can be light-shielded by mainly allowing an end portion of the pixel electrode 874 to overlap with the source wiring 839.

Manufacturing steps of the active-matrix substrate in accordance with the present embodiment will be described with reference to FIGS. 12A to 12C, 13A to 13C, 14A, and 14B.

Figure 12A:
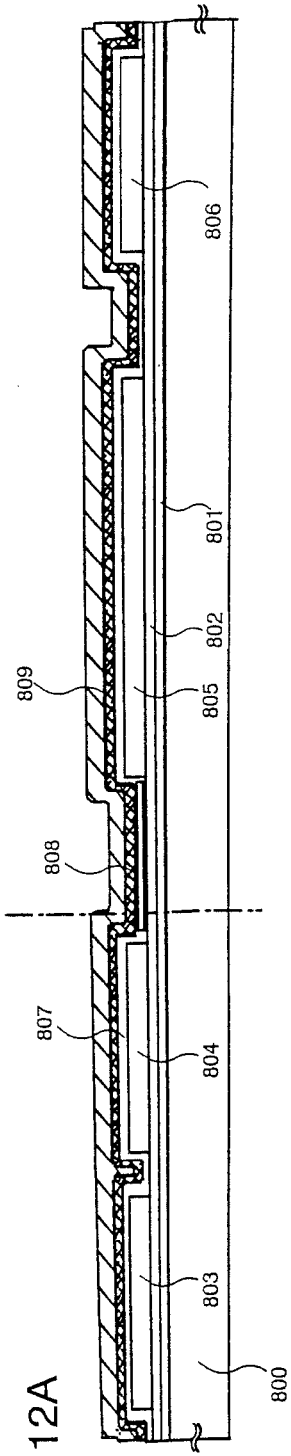
FIGS. 12A, 12B, and 12C each illustrate a cross-sectional view for explaining fabrication steps of a TFT in a pixel section and in a driver circuit portion in Embodiment 1.

As illustrated in FIG. 12A, base film 801 and 802 made of an insulating film, such as a silicon oxide film, a silicon nitride film, or a silicon oxynitride film, are formed on a substrate 800 made of a glass such as a barium borosilicate glass or a alumino borosilicate glass, typically a #7059 glass, a #1737 glass or the like available from Corning Co. For example, a silicon oxynitride film 801 made from $SiH_4$, $NH_3$, and $N_2O$ by a plasma CVD method is formed to have a thickness in the range from 10 to 200 nm (preferably 90 to 100 nm), and similarly, a hydrogenated silicon oxynitride film 802 made from $SiH_4$ and $N_2O$ is laminated thereon to have a thickness in the range from 90 to 200 nm (preferably 100 to 190 nm). Although the two-layered structure is employed in the present embodiment, a single-layered film of the above-mentioned insulating film may be used. Alternatively, a structure in which the two or more layers of the above-mentioned insulating films are laminated may be used.

The island-shaped semiconductor films 803 to 806 are made of a crystalline semiconductor film formed from a semiconductor film having an amorphous structure through a laser crystallization method or a known thermal crystallization method. Thicknesses of these island-shaped semiconductor films 803 to 806 are set in the range from 25 to 80 nm (preferably 30 to 60 nm). Although a constituent material of the crystalline semiconductor film is not limited to the specific one, the film is preferably made of silicon, or a silicon germanium (SiGe) alloy.

In order to manufacture the crystalline semiconductor film by means of the laser crystallization method, an excimer laser of the pulse-oscillation type or the continuous-emission type, a YAG laser or a $YVO_4$ laser is used. In the case where these lasers are to be used, the laser light emitted from a laser oscillator is converged in a linear shape by an optical system so that a semiconductor film is irradiated with the converged laser light. Although the crystallization conditions can be appropriately set by an operator, in the case where an excimer laser is to be used, a pulse oscillation frequency is set at 30 Hz, and a laser energy density is set in the range from 100 to 800 $mJ/cm^2$ (typically in the range from 200 to 300 $mJ/cm^2$). In the case where a YAG laser is to be used, a second harmonic wave is employed with a pulse oscillation frequency in the range from 1 to 10 kHz and a laser energy density in the range from 300 to 600 $mJ/cm^2$ (typically in the range from 390 to 900 $mJ/cm^2$). The entire substrate is irradiated with the linearly converged laser light having a width of 100 to 1000 μm, for example 800 μm, with an overlap ratio of the linear laser light in this case of 80 to 98%.

As another manufacturing method of the crystalline semiconductor film which forms an active layer of the TFT on the active-matrix substrate, a method for obtaining a crystalline semiconductor film through crystallization by means of catalytic elements, as disclosed in Japanese Patent Application Laid-open No. Hei 7-130652, may be used.

Then, a gate insulating film 807 is formed to cover the island-shaped semiconductor films 803 to 806. The gate insulating film 807 is formed of an insulating film containing silicon by a plasma CVD method or a sputtering method to have a thickness in the range from 80 to 190 nm. In the present embodiment, the gate insulating film 807 is made of a silicon oxynitride film having a thickness of 120 nm. Of course, the gate insulating film is not limited to such a silicon oxynitride film, but alternatively, the other insulating film containing silicon may be formed in a single layer or in a laminated structure. For example, in the case where a silicon oxide film is to be used, TEOS (tetraethyl orthosilicate) is mixed with $O_2$ by a plasma CVD method to form the film with the discharge at a high frequency (13.56 MHz) power density of 0.5 to 0.8 $W/cm^2$ under conditions of a reaction pressure of 80 Pa and a substrate temperature of 300 to 800° C. The silicon oxide film thus formed can be then provided with satisfactory characteristics as the gate insulating film by means of a thermal annealing at 800 to 900° C.

Thereafter, a first conductive film 808 and a second conductive film 809 are formed on the gate insulating film 807 for forming the gate electrode. In the present embodiment, the first conductive film 808 is made of TaN with a thickness in the range from 90 to 100 nm, while the second conductive film 809 is made of W with a thickness in the range from 100 to 300 nm.

In the case where a W film is to be formed, the film is formed by a sputtering method with W being used as a target. Alternatively, the W film can be formed through a thermal CVD method which employs tungsten hexafluoride ($WF_6$). In either case, the W film is required to have a low resistivity in order to be used as the gate electrode, and therefore, it is preferable that the resistivity of the W film is equal to or less than 20 μΩcm. Although the resistivity of the W film can be decreased by enlarging crystal grains of the W film, the crystallization of the W film is prevented when a large amount of impurity elements such as oxygen is contained in the W film, resulting in a larger resistivity. Thus, in the case where the W film is formed by a sputtering method, the resistivity in the range of 9 to 20 μΩcm can be realized by employing a W target having the purity of 99.9999% and paying sufficient attention so as not to allow impurities to be mixed into the film from the vapor phase during the film deposition.

Although in the present embodiment, the first conductive film 808 is made of TaN and the second conductive film 809 is made of W, both of these films may be formed of any element selected from the group consisting of Ta, W, Ti, Mo, Al, and Cu, or an alloy material or a compound material including the above-mentioned element as a main component. Alternatively, a semiconductor film, typically a polycrystalline silicon film including impurity elements such as phosphorus doped thereto, may be used. As the combination other than that described in the present embodiment, the first conductive film may be made of tantalum nitride (TaN) and the second conductive film may be made of Al, or the first conductive film may be made of tantalum nitride (TaN) and the second conductive film may be made of Cu.

Thereafter, masks 811 to 816 made of a resist are formed, and a first etching process is performed (see FIG. 12B) to form electrodes and lines. In the present embodiment, an ICP (Inductively Coupled Plasma) etching method is employed in which a mixed gas of $CF_4$ and $Cl_2$ is used as an etching gas and an RF (13.56 MHz) power of 900 W is applied to a coil-shaped electrode under a pressure of 1 Pa to generate plasma for performing the etching process. An RF (13.56 MHz) power of 100 W is also applied to a substrate side (sample stage) so that a substantially negative self-biased voltage is applied. In the case where $CF_4$ and $Cl_2$ are mixed, both the W film and the Ta film are etched away to the same extent.

In the above-mentioned etching conditions, the first conductive layer and the second, conductive layer can be formed to have end portions in a tapered-shape having a tapered angle of 15 to 85° due to an effect of the bias voltage to be applied to the substrate side by forming the resist masks in an appropriate shape. In order to perform the etching process without leaving any etching residue on the gate insulating film, it is preferable to increase an etching time period by approximately 10 to 20%. Since a selection ratio of a silicon oxynitride film against a W film is in the range from 2 to 4 (typically 3), a surface on which the silicon oxynitride film is exposed is etched away by about 20 to 90 nm by an overetching process. Thus, by the first etching process, first-shape conducting layers 820 to 825 (first conducting layers 820a to 825a and second conducting layers 820b to 825b) made of the first conducting layer and the second conducting layer are formed. Reference numeral 818 denotes a gate insulating film, and a region which is not covered with the first-shape conducting layers 820 to 825 is etched away by about 20 to 90 nm so that a thinned region is formed.

Figure 12B:
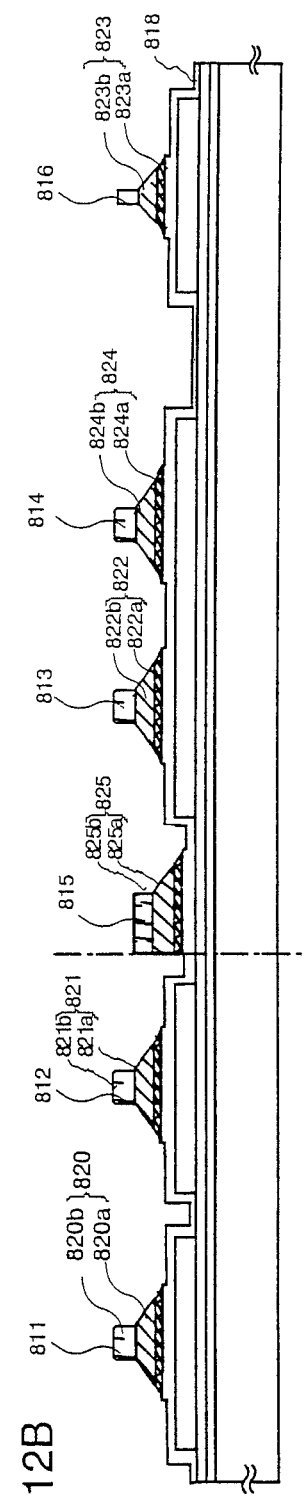
Figure 12C:
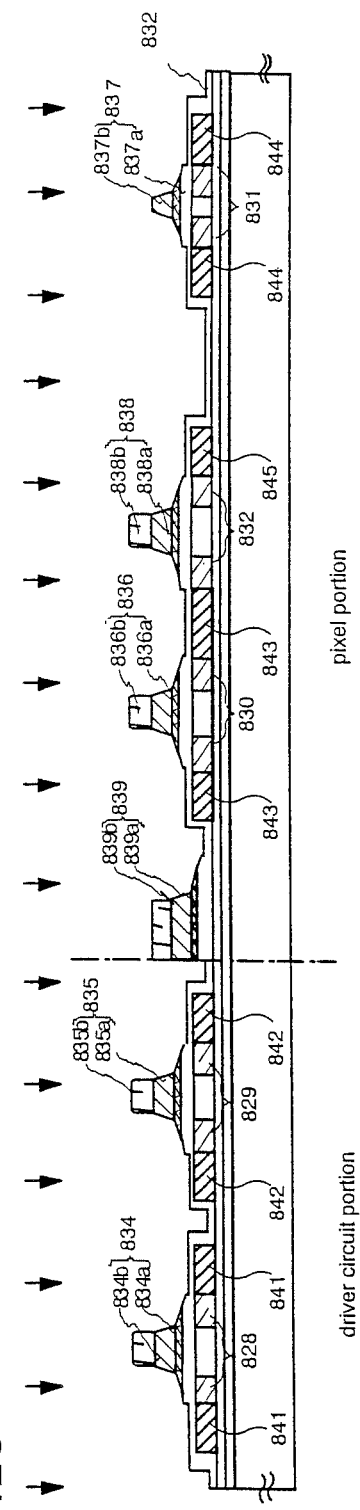

Thereafter, as shown in FIG. 12C, a second etching process is performed. An ICP etching method is similarly employed in which a mixed gas of $CF_4$, $Cl_2$ and $O_2$ is used as an etching gas and an RF power (13.56 MHz) of 900 W is applied to a coil-shape electrode under a pressure of 1 Pa to generate plasma for performing the etching process. An RF (13.56 MHz) power of 90 W is applied to a substrate side (sample stage) so that a self-biased voltage lower than that in the first etching process is applied. Under such conditions, the W film is anisotropically etched and TaN constituting the first conductive layers is anisotropically etched at a lower etching rate so as to form second-shape conducting layers 834 to 839 (first conducting layers 834a to 839a and second conducting layers 834b to 839b). Reference numeral 875 denotes a gate insulating film, and a region which is not covered with the second-shape conducting layers 834 to 839 is further etched away by about 20 to 90 nm so that a thinned region is formed.

Then, a first doping process is performed to add an impurity element providing the n-type conductivity with a middle acceleration at a low concentration. As a doping method, an ion-doping method or an ion implantation method may be used. An element belonging to Group 15, typically phosphorus (P) or arsenic (As), can be used as the impurity element providing the n-type conductivity, and in the present embodiment, phosphorus (P) is used. In this case, the conducting layers 834 to 838 function as a mask against the impurity element providing the n-type conductivity to form first impurity regions 828 to 832 in a self-alignment manner. In this specification, impurity regions covered with TaN as the first conducting layers (834a to 838a) are specifically referred to as the first impurity regions (828 to 832), while impurity regions that are not covered with TaN as the first conducting layers (834a to 838a) are specifically referred to as the second impurity regions (841 to 845). The concentration of the first impurity regions (828 to 832) is set to be in the range from $2 \times 10^{16}$ to $5 \times 10^{19}$ atoms/cm$^3$.

As shown in FIG. 13A, the gate conductive layers is etched by using the TaN constituting the first conducting layers (834a to 839a) as masks. A region in which the first insulating film and the gate insulating film do not overlap with each other is etched away. Thereafter, the resists 811 to 816 shown in FIG. 12B are peeled off by a peeling liquid containing N-methyl-2-pyrrolidone (NMP) as its main component.

Then, as shown in FIG. 13B, resists 846 to 848 are formed and a second doping process is performed. In this case, an impurity element providing the n-type conductivity is added into the island-shape semiconductor films with a high acceleration at a low concentration. Thereafter, an impurity element providing the n-type conductivity is added into the island-shape semiconductor films with a low acceleration at a high concentration. Thus, third impurity regions 850 to 858 as new impurity regions are formed at the end portions of the second impurity regions (denoted with reference numerals 841 to 845 in FIG. 12C) formed in the island-shape semiconductor film. Fourth impurity regions (866 and 867) having the impurity concentration lower than that in the third impurity regions are formed in a region to which the n-type impurity element has been added via the gate insulating film.

At this stage, the concentration of the first impurity regions (828, 830, 832) is set in the range from $2 \times 10^{16}$ to $5 \times 10^{19}$ atoms/cm$^3$. In addition, the concentration of the second impurity regions (841, 843, 845) is set in the range from $1 \times 10^{16}$ to $5 \times 10^{18}$ atoms/cm$^3$. The concentration of the n-type impurities of the third impurity regions (850 to 858) is set in the range from $1 \times 10^{20}$ to $1 \times 10^{22}$ atoms/cm$^3$. The concentration of the n-type impurities of the fourth impurity regions (866 and 867) is set to be lower than the concentration in the third impurity regions but higher than the concentration in the second impurity regions.

Then, as shown in FIG. 13C, after the resists 846 to 848 are peeled off, a resist 859 and a resist 860 are formed. A third doping process is performed with the resist 859 and the resist 860 being employed as masks. Thus, impurity elements providing the p-type conductivity are introduced into the island-shape semiconductor films to form a p-channel TFT. Fifth impurity regions (861 and 876) and sixth impurity regions 862 and 863 are formed in the island-shape semiconductor film 803. At this stage, the island-shape semiconductor layers 804 to 806 in which an n-channel TFT is to be formed are entirely covered with resists 859 and 860 as masks. The fifth impurity regions (861 and 876) and the sixth impurity regions 862 and 863 are provided with the impurity elements providing the p-type conductivity doped therein at concentrations different from each other. In the third doping process, an ion doping method employing diborane ($B_2H_6$) is used. The concentration of the impurity elements providing the p-type conductivity is set to be an amount sufficient for inverting the n-channel type impurity region into the p-channel type impurity region.

In accordance with the above-described process, the impurity regions are formed into the respective island-shape semiconductor films. The conducting layers 834 to 836 and the conducting layer 838 that overlap with the island-shape semiconductor films function as the gate electrodes of the TFTs. Reference numeral 839 denotes a source wiring and reference numeral 837 denotes a capacitor electrode.

Thereafter, as shown in FIG. 14A, a process for activating the impurity elements added to the respective island-shape semiconductor films is performed. This process is performed by a thermal annealing method which employs an annealing furnace. Alternatively, a laser annealing method or a rapid thermal annealing method (RTA method) can be applied. In the thermal annealing method, the process is performed at a temperature in the range of 600 to 900° C., typically 700 to 800° C., in a nitrogen atmosphere with an oxygen concentration of 1 ppm or less, preferably 0.1 ppm or less. In the present embodiment, the thermal treatment is performed at a temperature of 900° C. for 4 hours. However, in the case where wiring materials used for the component designated with reference numerals 834 to 839 do not have a sufficient resistance against heat, it is preferable to perform activation after an interlayer insulating film (containing silicon as a main component) is formed in order to protect the lines or the like.

Furthermore, a thermal process is performed at 300 to 890° C. for 1 to 12 hours in an atmosphere containing hydrogen of 3 to 100% to perform a process for hydrogenating the island-shape semiconductor layers. In this process, dangling bonds in the semiconductor layers are terminated with hydrogens thermally excited. A plasma hydrogenation (in which hydrogen excited by a plasma are used) may be performed as other means for hydrogenation.

Then, as shown in FIG. 14B, a first interlayer insulating film 864 is formed on the gate electrode and the gate insulating film. The first interlayer insulating film may be formed of a silicon oxide film, a silicon oxynitride film, a silicon nitride film, or a laminated layered film in which these films are combined. In either case, the first interlayer insulating film 864 is formed of an inorganic insulating material. A thickness of the first interlayer insulating film 864 is set in the range from 100 to 200 nm.

In this case, when a silicon oxide film is to be used, TEOS (Tetraethyl Orthosilicate) is mixed with $O_2$ in a plasma CVD method with a reaction pressure of 80 Pa and a substrate temperature of 300 to 800° C. in which the film is formed by discharge with a high frequency (176 MHz) power density of 0.5 to 0.8 W/cm². In the case where a silicon oxynitride film is to be used, a silicon oxynitride film may be formed from $SiH_4$, $N_2O$, and $NH_3$ by a plasma CVD method, or formed from $SiH_4$ and $N_2O$. The fabrication conditions in this case can be such that a reaction pressure is in the range from 20 to 200 Pa, a substrate temperature is in the range from 300 to 800° C., and a high frequency (60 MHz) power density is in the range from 0.1 to 1.0 W/cm². Alternatively, a silicon oxynitride film formed from $SiH_4$, $N_2O$, and $H_2$ may be used. A silicon nitride film can be also formed similarly from $SiH_4$ and $NH_3$ by a plasma CVD method. In the present embodiment, the first interlayer insulating film 864 is formed of a silicon oxynitride film to have a thickness in the range from 100 to 200 nm.

Thereafter, a second interlayer insulating film 865 made of an organic insulating material is formed so as to have an average thickness in the range from 1.0 to 2.0 μm. As the organic resin material, polyimide, acrylic, polyamide, polyimide-amide, BCB (benzocyclobutene) or the like can be used. For example, in the case where a polyimide which is thermally polymerized after being applied onto a substrate is to be used, the material is formed by being baked in a clean oven at 300° C. In the case where an acrylic resin is to be used, a two-liquid type material is used. A main component and a curing agent are mixed and the resultant mixture is applied onto the entire substrate by a spinner, and thereafter, a preliminary heating at 80° C. for 60 seconds is performed with a hot plate and the baking is further performed in a clean oven at 290° C. for 60 minutes.

By thus forming the second interlayer insulating film with an organic insulating material, a surface can be planarized in a satisfactory manner. In addition, since the organic resin material in general has a low dielectric constant, a parasitic capacitance can be reduced. However, the organic resin material exhibits water-absorbing characteristics, rendering the material inappropriate as a protection film. Accordingly, it is necessary to be combined with a silicon oxide film, a silicon oxynitride film, a silicon nitride film, or the like formed as the first interlayer insulating film 864, as in the present embodiment.

Thereafter, a photo mask is used to form a resist mask in a predetermined pattern, and contact holes are formed to reach a source region or a drain region formed in the respective island-shape semiconductor films. The contact holes are formed by a dry etching method. In this case, a mixture gas of $CF_4$, $O_2$, and He is used as an etching gas to first etch the second interlayer insulating film 865 made of the organic resin material, and thereafter, $CF_4$ and $O_2$ are then used as an etching gas to etch the first interlayer insulating film 864. Furthermore, the etching gas is switched into $CHF_3$ in order to increase a selection ratio against the island-shape semiconductor layers and the gate insulating film is etched. Thus, the contact holes can be formed in a satisfactory manner.

Thereafter, a conducting metal film is formed by a sputtering method or a vapor-deposition method, and a pattern of a photo mask is formed with a resist being used by a mask, so that the source wiring 866 and 867, the drain lines 868 and 869, the drain electrode 872, the source connecting electrode 870, the capacitor connecting electrode 873, and the gate wiring 871 are formed by an etching process.

At this stage, the drain electrode 872 functions by being electrically connected to the pixel electrode 874 to be described later. The capacitor connecting electrode 873 applies an electrical potential to the island-shape semiconductor layer 806 which is to function as an electrode of the storage capacitor 904. The gate wiring 871 is electrically connected to the gate electrode 836 and the gate electrode 838 by the contact hole, as described with reference to the top plan view in FIG. 16. It should be noted that the storage capacitor 904 in the present embodiment exists in the same pixel as the pixel electrode 874.

In FIG. 14, a Ti film as the conducting metallic film is formed to have a thickness in the range from 90 to 190 nm so as to form a contact with the source is region or the drain region in the island-shape semiconductor film, and aluminum (Al) is further overlaid on the Ti film to have a thickness in the range from 300 to 800 nm, and thereafter, a Ti film or a titanium nitride (TiN) film is formed to have a thickness in the range from 100 to 200 nm, so that a three-layered structure is obtained. In such a structure, the pixel electrode 874 to be described later is to contact only the Ti film which constitutes the drain electrode 872 and the capacitor connecting electrode 873. As a result, the transparent conductive film can be prevented from being reacted with Al.

Thereafter, a transparent conductive film is formed over the entire surface, and the pixel electrode 874 is formed by a patterning process and an etching process that employ a photo mask. The pixel electrode 874 is formed on the interlayer insulating film 865 so as to include portions overlapping the drain electrode 872 in the pixel TFT 903 and the capacitor connecting electrode 873 of the storage capacitor 904, thereby resulting in a connection structure being formed. Thus, the island-shape semiconductor film 806 functioning as an electrode of the storage capacitor 904 is electrically connected to the pixel electrode 874.

As a material for the transparent conductive film, indium oxide ($In_2O_3$), indium tin oxide ($In_2O_3$—$SnO_2$; an ITO film) alloy or the like can be formed by a sputtering method, a vacuum evaporation method or the like. An etching process of such a material is performed by means of a solution of the hydrochloric acid type. However, especially in an etching process of an ITO film, etching residue are likely to be to generated. Thus, in order to improve the etching processibility, an indium oxide zinc oxide alloy ($In_2O_3$—$ZnO$) may be used. The indium oxide zinc oxide alloy has excellent surface smoothness and satisfactory thermal stability in contrast to an ITO film, so that even in the case where Al is used for the drain line 872 and the capacitor connecting line 873, a corrosive reaction with Al which is to contact on the surface can be prevented. Similarly, zinc oxide (ZnO) is also an appropriate material, and furthermore, other materials, such as zinc oxide to which gallium (Ga) is added for improving the transmittance of visible light or a conductivity (indicated as ZnO:Ga), may be used.

When the hydrogenation process is performed under this condition, preferable effects with respect to improvements in the TFT characteristics can be obtained. For example, it is preferable to perform a thermal treatment in an atmosphere containing hydrogen of 3 to 100% at 300 to 890° C. for 1 to 12 hours. Alternatively, the same results can be achieved also by a plasma hydrogenation method. It is desirable to reduce the defect density in the island-shape semiconductor films 803 to 806 at $10^{16}$/cm$^3$ or lower, and the above purpose ban be realized by adding hydrogen at about 0.01 to 0.1 atomic %.

As described in the above, the driver circuit portion 905 (including the p-channel type TFT 901 and the n-channel type TFT 902), the pixel TFT 903, and the storage capacitor 904 can be formed on the same substrate. In the present specification, such a substrate is referred to as the active-matrix substrate.

In accordance with the fabricating process as described in the present embodiment, the number of the photo masks required for fabricating the active-matrix substrate can be set at seven (i.e., the island-shape semiconductor layer pattern, a first wiring pattern [the gate electrode, the source wiring, and the capacitor wiring], the n-channel region mask pattern, the p-channel region mask pattern, the contact hole pattern, the second line pattern [the source wiring, the drain line, the source connecting electrode, the drain electrode, the capacitor connecting electrode, and the gate wiring], and the pixel electrode pattern).

Figure 15:
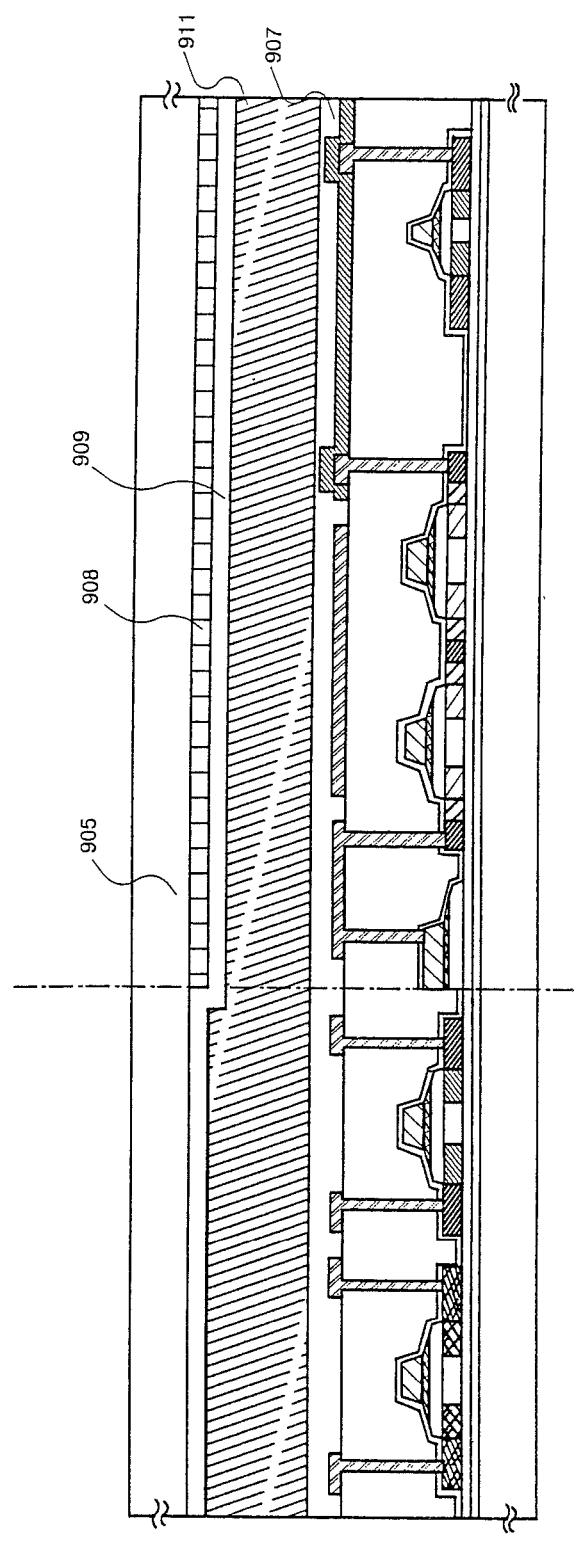
FIG. 15 illustrates a cross-sectional view of a liquid crystal electro-optical device in Embodiment 1.

Then, as shown in FIG. 15, an ITO film 908 as the transparent conductive film is formed on a transparent insulating substrate 910 to have a thickness of 120 nm. In order to prevent any parasitic capacitance from being generated, a portion of the ITO film over the driver circuit portion is removed by a patterning process and an etching process employing a photo mask. The ITO film 908 functions as an opposing electrode. In the present specification, such a substrate is referred to as a opposing substrate.

In order to realize a color display, color filters are formed on the opposing substrate. More specifically, the three primary colors in the additive color mixture, i.e., red, blue and green, are arranged in parallel. With this structure, a better color purity can be obtained as compared to the case where the subtractive color filters of cyan, magenta, and yellow are arranged in parallel.

An alignment film 907 and a polarizing film 909 are formed on the active-matrix substrate and on the opposing substrate, respectively, to each have a thickness of 80 nm. As these polarizing films, SE7792 (Nissan Chemical) is used.

Spacers (not illustrated) are scattered by a wet scattering method or a dry scattering method. Spacers may be formed by forming a photosensitive organic resin at predetermined positions by patterning. The height of the spacers is set at 4 µm.

Thereafter, a sealing member (not illustrated) is provided on the opposing substrate by a dispense drawing method. After the sealing member is applied, the sealing member is baked at 90° C. for about 0.5 hours.

After the above-mentioned process steps, the active-matrix substrate and the opposing substrate are adhered to each other. The active-matrix substrate and the opposing substrate are arranged so that the respective rubbing directions thereof cross with each other at the right angle upon the adhesion. A pressure of 0.3 to 1.0 kgf/cm$^2$ is applied to a pair of the thus adhered substrates over the entire substrate surface in the direction perpendicular to the substrate surface. Simultaneously, a heating process is performed in a clean oven at 160° C. for about two hours so that the sealing member is allowed to be cured, thereby resulting in the active-matrix substrate and the opposing substrate being securely adhered.

Then, after the adhered pair of substrates is cooled down, it is divided by means of a scriber and a breaker.

Liquid crystal 911 is then injected by a vacuum injection method. A panel after being divided is provided within a vacuum chamber. After the vacuum chamber is evacuated by a vacuum pump to a vacuum condition of about $1.33 \times 10^{-5}$ to $1.33 \times 10^{-7}$ Pa, an injection port is immersed into a liquid crystal saucer filled with the liquid crystal. As the liquid crystal, ZLI4792 (Merk) is used.

Then, when the vacuum chamber in the vacuum condition is gradually leaked by means of nitrogen so as to return to an atmospheric pressure, the liquid crystal is injected through the injection port of a liquid crystal panel due to a pressured difference between the air pressure in the panel and the atmospheric pressure as well as the capillary action of the liquid crystal, so that the liquid crystal gradually moves from a side closer to the injection port toward the opposite side, thereby completing the injection process.

After confirming that the inside of the sealing member is filled with the liquid crystal, a pressure is applied onto both surfaces of the liquid crystal panel. After 15 minutes, extra liquid crystal material is wiped away. An UV-curable resin (not illustrated) is applied to the injection port while the pressure being still applied, and then the applied pressure is reduced. At this stage, the UV-curable resin enters into the inside. The UV-curable resin is irradiated with UV rays (4 to 10 mW/cm$^2$, for 120 seconds) under this condition, so that the UV-curable resin is allowed to be cured, thereby resulting in the injection port being sealed.

Thereafter, the liquid crystal existing on the substrate surface and on the end surface is washed out by an organic solvent, for example, acetone and ethanol. The liquid crystal is then allowed to be re-oriented at 130° C. for about 0.5 hour.

A flexible print circuit (FPC) is then connected, and polarizing plates are adhered to the active-matrix substrate and the opposing substrate, respectively, thereby completing a TN-type liquid crystal electro-optical device.

In the present embodiment, the transmission type liquid crystal electro-optical device has been fabricated. Furthermore, by combining the back light as the illumination apparatus in accordance with the present invention as disclosed in Embodiment Mode 1 with the transmission type liquid crystal electro-optical device in the present embodiment, power consumption can be reduced while an image with a uniform in-plane brightness distribution can be recognized by a viewer.

In the present embodiment, by patterning the drain electrode 872 in FIG. 14B as the pixel electrode in a wider area, a reflection type liquid crystal electro-optical device can be fabricated. By employing the front light as the illumination apparatus in accordance with the present invention as disclosed in Embodiment Mode 2, power consumption can be reduced while an image with a uniform in-plane brightness distribution can be recognized by a viewer.

Embodiment 2

The lighting apparatus formed by implementing the present invention can be used in a variety of electro-optical devices. Namely, the present invention can be implemented for all electronic equipment, which incorporates this type of electro-optical device in a display portion. The following can be given as such electronic equipment: a personal computer, a digital camera, a video camera, a portable information terminal (such as a mobile computer, a portable telephone, or an electronic book) and a navigation system. Some examples of these are shown in this embodiment.

Figure 17A:
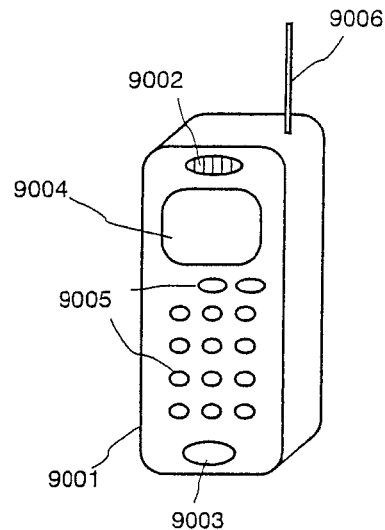
FIGS. 17A to 17F each illustrate a perspective view for explaining an example of a semiconductor device in Embodiment 2.

FIG. 17A shows a portable telephone, and contains components such as a main body 9001, an audio output portion 9002, an audio input portion 9003, a display portion 9004, operation switches 9005, and an antenna 9006. The present invention can be applied to the display portion 9004 having an active matrix substrate.

Figure 17B:
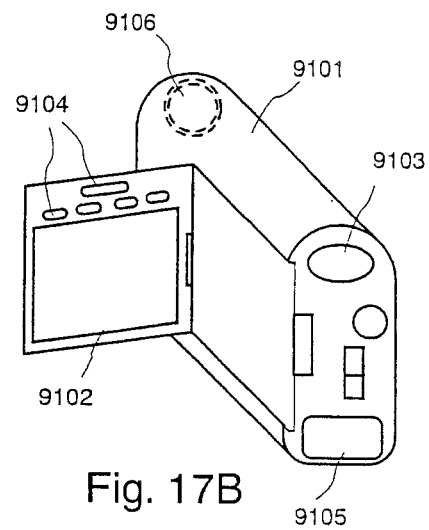

FIG. 17B shows a video camera and contains components such as a main body 9101, a display portion 9102, an audio input portion 9103, operation switches 9104, a battery 9105, and an image receiving portion 9106. The present invention can be applied to the display portion 9102.

Figure 17C:
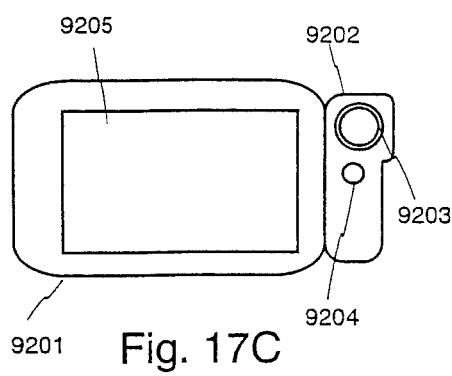

FIG. 17C shows a mobile computer or a portable information terminal and contains components such as a main body 9201, a camera portion 9202, an image receiving portion 9203, operation switches 9204, and a display portion 9205. The present invention can be applied to the display portion 9205.

Figure 17D:
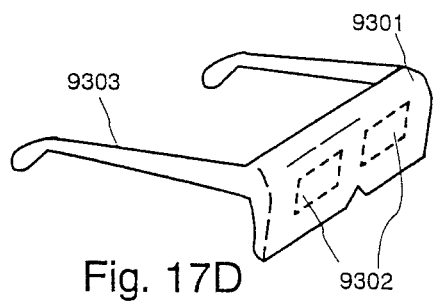

FIG. 17D shows a head mount display and contains components such as a main body 9301, a display portion 9302, and an arm portion 9303. The present invention can be applied to the display portion 9302.

Figure 17E:
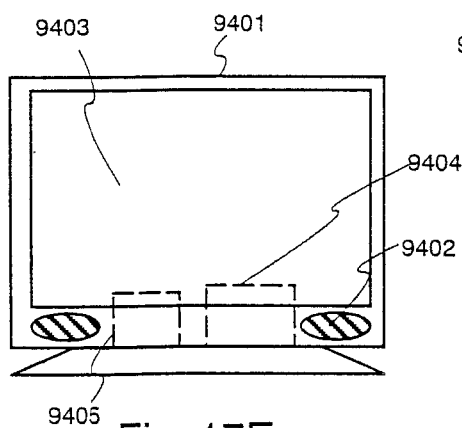

FIG. 17E shows a television and contains components such as a main body 9401, a speaker 9402, a display portion 9403, a receiving device 9404, an amplifier 9405 and so forth. The present invention can be applied to a display portion 9403.

Figure 17F:
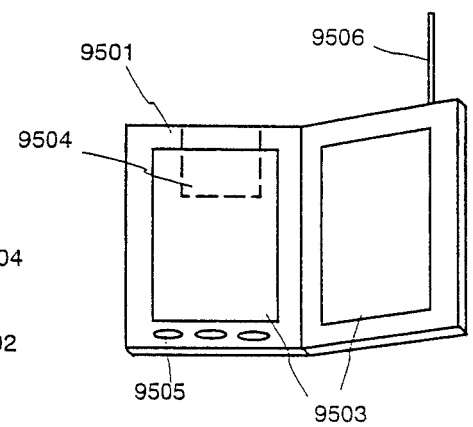

FIG. 17F shows a portable electronic book that is composed of a main body 9501, display devices 9502, 9503, a memory medium 9504, an operation switch 9505 and an antenna 9506. The book is used to display data stored in a mini-disk (MD) or a DVD, or a data received with the antenna. The display devices 9502, 9503 are direct-vision type display devices and the present invention can be applied to the display devices 9502, 9503.

Figure 18A:
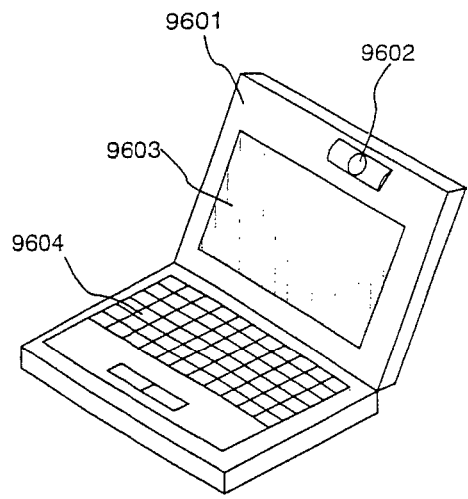
FIGS. 18A, 18B, and 18C each illustrate a perspective view for explaining an example of a semiconductor device in Embodiment 2.

FIG. 18A shows a personal computer and contains components such as a main body 9601, an image input portion 9602, a display portion 9603, and a keyboard 9604. The present invention can be applied to the display portion 9603.

Figure 18B:
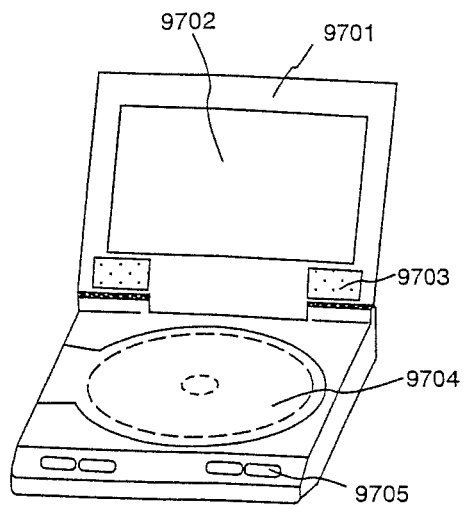

FIG. 18B shows a player which uses a recording medium with a program recorded therein (hereinafter referred to as recording medium) and contains components such as main body 9701, a display portion 9702, a speaker portion 9703, a recording medium 9704, and operation switches 9705. Note that a DVD (Digital Versatile Disk), CD, etc. is used as a recording medium for this player, and that appreciation of music or a movie or performing games or the Internet can be done. The present invention can be applied to the display device 9702.

Figure 18C:
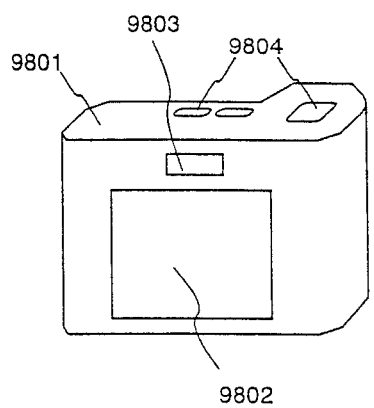

FIG. 18C shows a digital camera and contains components such as a main body 9801, a display portion 9802, an eye piece portion 9803, operation switches 9804, and an image receiving portion (not shown in the figure). The present invention can be applied to the display portion 9802.

Thus, as described in the above, in accordance with the present invention, a point light source such as a light emitting diode can be converted into a line light source by means of a linear light guiding plate, and furthermore, the line light source can be converted into a plane light source by means of a plane-like light guiding plate. By thus converting the point light source into the plane light source in the two stages, a uniform plane light source can be obtained. In this case, it is only required, to provide the light emitting diode on a side surface of the linear light guiding plate, and therefore, the uniform plane light source can be obtained even when only a small number of the light emitting diodes are used. Furthermore, by designing the light propagation direction by means of the linear light guiding plate, a light source having excellent in-plane uniformity can be obtained.

In accordance with the present invention, the plane light source can be obtained from a piece of plate-like light guiding plate by allowing light emitted from the point light source to be incident on at least two of the side surfaces of the plate-like light guiding plate.

In addition, in accordance with the present invention, an illumination apparatus which is more suitable to portable terminal applications can be fabricated by employing a light emitting diode that has small power consumption and is a small-sized point light source.

What is claimed is:
1. A semiconductor device comprising:
   a semiconductor film and a gate electrode with a gate insulating film interposed therebetween;
   a conductive film;
   an insulating film over the gate electrode and the conductive film; and a gate wiring over the gate electrode and the conductive film, wherein the insulating film comprises an organic insulating material, wherein the gate electrode and the conductive film each comprise the same material, and wherein the gate wiring extends across the conductive film.

2. A semiconductor device according to claim 1, further comprising:

a second conductive film over the insulating film, wherein the conductive film is electrically connected to the semiconductor film through the second conductive film.

3. A semiconductor device according to claim 1, wherein the gate electrode is over the semiconductor film.

4. A semiconductor device according to claim 1, further comprising a liquid crystal layer over the gate wiring.

5. A semiconductor device according to claim 1, wherein the semiconductor device is incorporated in at least one selected from the group consisting of a personal computer, a digital camera, a mobile telephone, a video camera, a mobile computer, a head mount display, a television, an electronic book, a player which use a recording medium, and a navigation system.

6. A semiconductor device comprising:

a first conductive film including a gate electrode portion and a capacitor electrode portion;

a first semiconductor film;

a gate insulating film between the gate electrode portion and the first semiconductor film;

an insulating film over the first conductive film;

a gate wiring over the insulating film; and a capacitor comprising the capacitor electrode portion as a first capacitor electrode and a second semiconductor film as a second capacitor electrode, wherein the first conductive film extends across the gate wiring.

7. A semiconductor device according to claim 6, wherein the insulating film comprises an organic resin material.

8. A semiconductor device according to claim 6, further comprising:

a second conductive film; and a third conductive film over the insulating film, wherein the second conductive film is electrically connected to the first semiconductor film through the third conductive film.

9. A semiconductor device according to claim 6, wherein the first conductive film is over the first semiconductor film.

10. A semiconductor device according to claim 6, further comprising a liquid crystal layer over the gate wiring.

11. A semiconductor device according to claim 6, wherein the semiconductor device is incorporated in at least one selected from the group consisting of a personal computer, a digital camera, a mobile telephone, a video camera, a mobile computer, a head mount display, a television, an electronic book, a player which use a recording medium, and a navigation system.

12. A semiconductor device according to claim 6, wherein bottom surfaces of the first semiconductor film and the second semiconductor film are coplanar.

* * * * *